United States Patent
Fukuda et al.

(10) Patent No.: US 11,859,312 B2
(45) Date of Patent: Jan. 2, 2024

(54) METHOD OF CLEANING A GROUP III-NITRIDE SINGLE CRYSTAL SUBSTRATE COMPRISING CLEANING A NITROGEN-POLAR FACE WITH A DETERGENT INCLUDING A FLUOROORGANIC COMPOUND

(71) Applicant: TOKUYAMA CORPORATION, Shunan (JP)

(72) Inventors: Masayuki Fukuda, Shunan (JP); Reo Yamamoto, Shunan (JP)

(73) Assignee: TOKUYAMA CORPORATION, Shunan (JP)

( * ) Notice: Subject to any disclaimer, the term of this patent is extended or adjusted under 35 U.S.C. 154(b) by 0 days.

(21) Appl. No.: 18/022,417

(22) PCT Filed: Aug. 17, 2022

(86) PCT No.: PCT/JP2022/031086
§ 371 (c)(1),
(2) Date: Feb. 21, 2023

(87) PCT Pub. No.: WO2023/026924
PCT Pub. Date: Mar. 2, 2023

(65) Prior Publication Data
US 2023/0313413 A1 Oct. 5, 2023

(30) Foreign Application Priority Data
Aug. 23, 2021 (JP) .................................. 2021-135901

(51) Int. Cl.
*C30B 33/10* (2006.01)
*C30B 33/00* (2006.01)
(Continued)

(52) U.S. Cl.
CPC ................ *C30B 33/00* (2013.01); *B08B 3/08* (2013.01); *B08B 3/12* (2013.01); *C11D 7/24* (2013.01);
(Continued)

(58) Field of Classification Search
CPC ......... C30B 23/02; C30B 25/00; C30B 25/18; C30B 25/186; C30B 29/00; C30B 29/10;
(Continued)

(56) References Cited

U.S. PATENT DOCUMENTS

2005/0166835 A1 8/2005 Koukitsu et al.
2006/0003134 A1 1/2006 Uemura et al.
(Continued)

FOREIGN PATENT DOCUMENTS

CN 1863901 A 11/2006
JP 2006-16249 A 1/2006
(Continued)

OTHER PUBLICATIONS

International Search Report for PCT/JP2022/031086 (PCT/ISA/210) dated Oct. 18, 2022.
(Continued)

*Primary Examiner* — Kenneth A Bratland, Jr.
(74) *Attorney, Agent, or Firm* — Birch, Stewart, Kolasch & Birch, LLP

(57) ABSTRACT

Provided are a method of cleaning a group III nitride single crystal substrate which enables the roughness of a nitrogen-polar face of the group III nitride single crystal substrate to be suppressed to remove foreign substances, and a method of producing a group III nitride single crystal substrate. The method of cleaning a group III nitride single crystal substrate having a group III element-polar face, and the nitrogen-polar face opposite the group III element-polar face
(Continued)

includes: cleaning the nitrogen-polar face with a detergent including a fluoroorganic compound.

10 Claims, 2 Drawing Sheets

(51) Int. Cl.
- *C30B 29/40* (2006.01)
- *C30B 23/02* (2006.01)
- *C11D 7/24* (2006.01)
- *B08B 3/12* (2006.01)
- *C11D 7/30* (2006.01)
- *B08B 3/08* (2006.01)

(52) U.S. Cl.
CPC ............... *C11D 7/30* (2013.01); *C30B 23/02* (2013.01); *C30B 29/403* (2013.01)

(58) Field of Classification Search
CPC ..... C30B 29/40; C30B 29/403; C30B 29/406; C30B 33/00; C30B 33/08; C30B 33/10; B08B 3/04; B08B 3/08; B08B 3/12; C11D 7/24; C11D 7/30
USPC ....... 117/84, 88, 94, 97, 101, 106, 937, 952; 134/1, 1.1, 1.2, 1.3, 42
See application file for complete search history.

(56) References Cited

U.S. PATENT DOCUMENTS

| | | | |
|---|---|---|---|
| 2015/0167198 A1* | 6/2015 | Machuca | ............ C30B 25/183 |
| | | | 117/106 |
| 2017/0260650 A1 | 9/2017 | Ariyuki | |
| 2017/0330745 A1 | 11/2017 | Nagashima et al. | |
| 2019/0093255 A1 | 3/2019 | Nagashima et al. | |
| 2020/0299862 A1 | 9/2020 | Fukuda et al. | |
| 2022/0010242 A1 | 1/2022 | Ogino et al. | |

FOREIGN PATENT DOCUMENTS

| | | | |
|---|---|---|---|
| JP | 3803788 B2 | | 8/2006 |
| JP | 2013-211314 A | | 10/2013 |
| JP | 2013-211315 A | | 10/2013 |
| JP | 2013211314 A | * | 10/2013 |
| JP | 2016-94337 A | | 5/2016 |
| JP | 2018-78260 A | | 5/2018 |
| WO | WO 2016/039116 A1 | | 3/2016 |
| WO | WO 2017/164233 A1 | | 9/2017 |
| WO | WO 2019/059381 A1 | | 3/2019 |
| WO | WO 2020/166703 A1 | | 8/2020 |

OTHER PUBLICATIONS

Written Opinion of the International Searching Authority for PCT/JP2022/031086 (PCT/ISA/237) dated Oct. 18, 2022.

* cited by examiner

METHOD OF CLEANING A GROUP III-NITRIDE SINGLE CRYSTAL SUBSTRATE COMPRISING CLEANING A NITROGEN-POLAR FACE WITH A DETERGENT INCLUDING A FLUOROORGANIC COMPOUND

TECHNICAL FIELD

The present invention relates to a method of cleaning a group III nitride single crystal substrate, and a method of producing a group III nitride single crystal substrate which includes this cleaning method.

BACKGROUND ART

A group III nitride semiconductor including aluminum (Al) ($Al_xGa_yIn_zN$ where $X+Y+Z=1$, $0<X\leq1$, $0\leq Y\leq1$ and $0\leq Z\leq1$) has a direct band gap structure in an ultraviolet region corresponding to 200 nm to 360 nm in wavelength, and thus, a highly efficient ultraviolet light emitting device can be produced therefrom. Such a group III nitride semiconductor device is produced by crystal growth of group III nitride semiconductor thin films over a single crystal substrate by a vapor phase epitaxy method such as metal organic chemical vapor deposition (MOCVD), molecular beam epitaxy (MBE), and hydride vapor phase epitaxy (HVPE). Among them, MOCVD is a currently most frequently used technique for industrial use because enabling film thickness to be controlled at the level of an atomic layer and because leading to a relatively high growth rate.

As the single crystal substrate for the crystal growth of group III nitride semiconductor thin films, a group III nitride single crystal substrate obtained by a known crystal growth method, such as a GaN or AlN single crystal substrate, is used. Particularly, it is necessary to suppress the absorption of ultraviolet rays by the substrate for obtaining highly efficient ultraviolet devices. As a method of producing a group III nitride single crystal substrate having a high ultraviolet light transparency, the method of producing a group III nitride single crystal substrate by HVPE has been proposed so far (see patent literature 1 or 2).

Concerning such a group III nitride single crystal substrate used for a group III nitride semiconductor, after a group III nitride single crystal layer is produced by the foregoing method, normally, both faces are processed, for example, are ground for reducing the roughness of, and for adjusting the thickness of the single crystal layer, and thereafter, a face where group III nitride semiconductor thin films such as an n-type layer, an active layer, and a p-type layer are subjected to crystal growth (hereinafter also referred to as a "crystal growth face". This face is normally a polar face of a group III element.) is processed to be a super-flat face by, for example, chemical mechanical planarization (CMP) an abrasive such as a colloidal silica. Such processing on a crystal growth face to be a super-flat face enables group III nitride semiconductor thin films to be easily layered over the substrate, and thus, a high-quality product to be obtained. Further, by cutting a group III nitride semiconductor wafer obtained by the crystal growth of the group III nitride semiconductor thin films, an ultraviolet light emitting device can be obtained.

It is known that on the group III element-polar face that is a crystal growth face after polishing by CMP, foreign substances difficult to remove, such as foreign substances considered to be derived from inorganic substances including shaved substrate chips, and abrasives used for the polishing (hereinafter also referred to as "inorganic foreign substances"), and foreign substances considered to be derived from organic substances including tapes and waxes that are used for fixing the group III nitride single crystal substrate, or used for protecting the surface thereof are present. These foreign substances are desired to remove because causing defects such as dislocation due to lattice mismatch when the group III nitride semiconductor thin films are grown over the group III element-polar face. As a method of removing these foreign substances, alkali cleaning that is effective at removing even minute foreign substances to a certain degree has been proposed. While a group III nitride single crystal tends to be etched by an alkali, keeping the concentration of the alkali in an alkaline cleaning liquid at a certain level or lower enables foreign substances to be effectively removed while suppressing the etching of the group III element-polar face by the alkali (patent literature 3).

In recent years, the method of not only processing a group III element-polar face but also further processing a nitrogen-polar face that is opposite the group III element-polar face to be super-flat faces in addition to the group III element-polar face has been proposed. Processing both the group III element-polar face and the nitrogen-polar face to be super-flat faces can lead to production of ultraviolet light emitting devices of much less variations in performance with a high yield in addition to the aforementioned effect (patent literature 4).

Such processing on the nitrogen-polar face to be a super-flat face leads to a significant impact of foreign substances even on the nitrogen-polar face, which further makes it necessary to remove foreign substances present on the nitrogen-polar face. On the nitrogen-polar face, the impact of organic foreign substances is especially significant, and thus, a method of removing organic foreign substances is desired.

For this, it is reported that the method of cleaning a gallium nitride substrate having an m-plane (nonpolar face represented by (1–10)) as a main face by means of a mixture liquid of sulfuric acid and a hydrogen peroxide solution (SPM cleaning) can lead to easy reduction of organic foreign substances with the smoothness of the group III nitride single crystal substrate maintained (patent literature 5).

CITATION LIST

Patent Literature

Patent Literature 1: JP 3803788 B2
Patent Literature 2: JP 2016-94337 A
Patent Literature 3: WO 2016/039116 A1
Patent Literature 4: JP 2018-78260 A
Patent Literature 5: JP 2013-211315 A

SUMMARY OF INVENTION

Technical Problem

However, it is clarified by the research of the inventors of the present invention that: when subjected to the SPM cleaning described in patent literature 5, the nitrogen-polar face may roughen because of the action of a detergent, and it is difficult to control specific conditions under which the SPM cleaning can be performed without the nitrogen-polar face roughened.

In contrast, it is known that a nitrogen-polar face is not always highly resistant to alkalis compared with a group III element-polar face, but is etched by alkalis immediately. Therefore, as well as the group III element-polar face, the nitrogen-polar face is etched to be rough, and thereby, may lose the smoothness although processed to be a super-flat face when cleaned by the cleaning method with an alkaline cleaning liquid, which is described in patent literature 3. In view of such circumstances, it is demanded to establish an effective cleaning method that enables foreign substances to be removed without the nitrogen-polar face roughened.

Therefore, an object of the present invention is to provide a method of cleaning a group III nitride single crystal substrate which enables the roughness of a nitrogen-polar face of the group III nitride single crystal substrate to be suppressed to remove foreign substances, and a method of producing a group III nitride single crystal substrate.

Solution to Problem

The inventors of the present invention assiduously researched methods of cleaning a nitrogen-polar face of a group III nitride single crystal substrate and found a detergent which enables foreign substances present on the nitrogen-polar face of the group III nitride single crystal substrate to be removed, and to which the group III nitride single crystal substrate is chemical-resistant, and finally completed the following present invention.

[1] A method of cleaning a group III nitride single crystal substrate having a group III element-polar face, and a nitrogen-polar face opposite the group III element-polar face, the method comprising:
cleaning the nitrogen-polar face with a detergent including a fluoroorganic compound.

[2] The method of cleaning a group III nitride single crystal substrate according to [1], wherein the fluoroorganic compound includes hydrofluorocarbon.

[3] The method of cleaning a group III nitride single crystal substrate according to [2], wherein the hydrofluorocarbon is a compound represented by the following formula (1):

$$C_nH_{2n+2-m}F_m \qquad (1)$$

where in the formula (1), n is an integer of 2 to 8, and m is an integer satisfying $3 \le m \le 2n+2$.

[4] The method of cleaning a group III nitride single crystal substrate according to any one of [1] to [3], wherein the detergent has a specific gravity at 25° C. of 0.80 to 1.28.

[5] The method of cleaning a group III nitride single crystal substrate according to any one of [1] to [4], wherein the detergent further includes a hydrocarbon compound.

[6] The method of cleaning a group III nitride single crystal substrate according to any one of [1] to [5], wherein
surface roughness of the nitrogen-polar face of the group III nitride single crystal substrate is at most 4.0 nm.

[7] A method of producing a group III nitride single crystal substrate having a group III element-polar face, and a nitrogen-polar face opposite the group III element-polar face, the method comprising:
preparing the group III nitride single crystal substrate;
polishing at least the nitrogen-polar face; and
cleaning the nitrogen-polar face by the method of cleaning a group III nitride single crystal substrate according to any one of [1] to [6] after either one of the preparing and the polishing.

[8] The method of producing a group III nitride single crystal substrate according to [7], wherein the cleaning is performed after the polishing.

[9] The method of producing a group III nitride single crystal substrate according to [7] or [8], wherein
the cleaning further includes immersing the group III nitride single crystal substrate in the detergent, and irradiating the detergent, in which the group III nitride single crystal substrate is immersed, with an ultrasonic wave.

The method of producing a group III nitride single crystal substrate according to any one of [7] to [9], wherein
the cleaning further includes: first cleaning the group III nitride single crystal substrate with the detergent; and second cleaning the group III nitride single crystal substrate after the first cleaning with a rinse agent having a higher content of the fluoroorganic compound than the detergent in the first cleaning.

Advantageous Effects of Invention

The present invention enables the roughness of a nitrogen-polar face of a group III nitride single crystal substrate to be suppressed to remove foreign substances. The present invention also enables a group III nitride single crystal substrate having both a group III element-polar face and a nitrogen-polar face on which the amount of residual foreign substances is reduced to be efficiently produced.

BRIEF DESCRIPTION OF DRAWINGS

FIG. 2 shows samples of the evaluation of the condition of a nitrogen-polar face.

DESCRIPTION OF EMBODIMENTS

Overview of Embodiments

Figure 1:
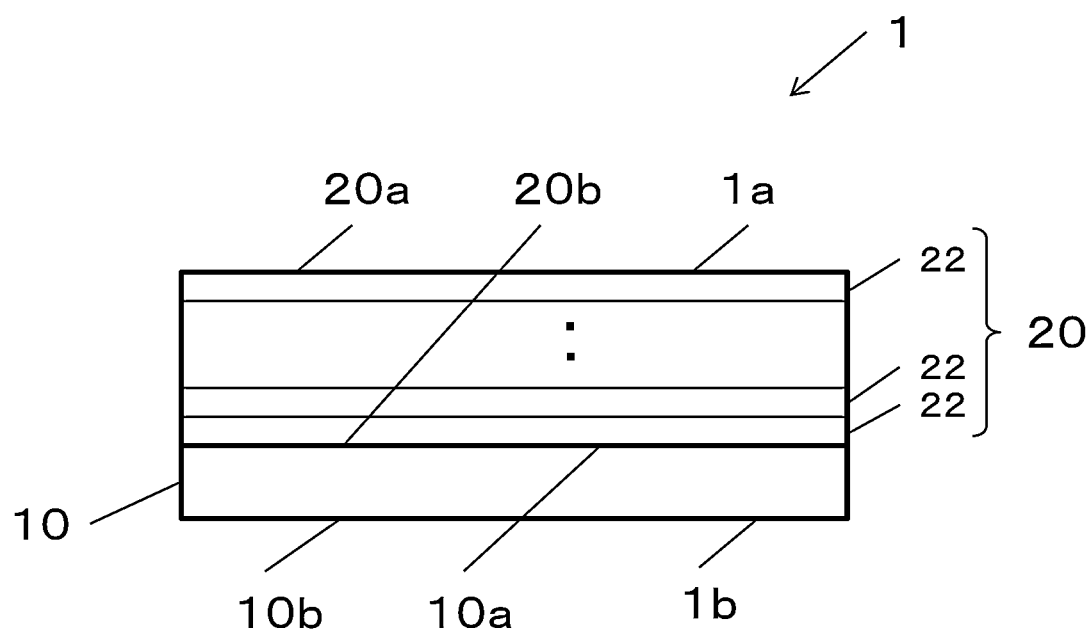
FIG. 1 schematically shows an aluminum nitride single crystal substrate according to one embodiment of the present invention.

In the present invention, "foreign substances" is a general term for adhered materials adhering to the surface of a group III nitride single crystal substrate, that is, either one or both of a group III element-polar face and a nitrogen-polar face; "inorganic foreign substances" among the "foreign substances" mean adhered materials formed from an inorganic compound such as substrate chips shaved in polishing, abrasives used for polishing, group III nitride particles that had been in the environment but adhered after a polishing step, and particles derived from a crystal growth apparatus (such as BN, $SiO_2$ and C); and "organic foreign substances" among the "foreign substances" mean adhered materials including an organic compound such as waxes, and adhesives or tapes which are used for fixing a group III nitride single crystal substrate in polishing, and sebaceous matters adhering when a group III nitride single crystal substrate is handled.

A feature of the cleaning method according to one embodiment of the present invention is to clean, with a detergent including a fluoroorganic compound, a nitrogen-polar face of a group III nitride single crystal substrate that has a group III element-polar face such as a gallium (Ga), aluminum (Al) or indium (In) polar face, and the nitrogen-polar face opposite the group III element-polar face. A CMP polishing step or the like which is carried out on the surface of the foregoing group III nitride single crystal substrate when the substrate is produced may lead to the presence of inorganic foreign substances such as substrate chips shaved due to the CMP polishing step, and abrasives used for the polishing, and organic foreign substances difficult to remove, such as tapes and waxes that are used for fixing the group III nitride single crystal substrate, on the surface of the substrate (that is, the surface of the group III element-polar face, and the surface of the nitrogen-polar face). Cleaning with a detergent including a fluoroorganic compound as the cleaning or production method according to this embodiment enables the roughness of the surface of the group III nitride single crystal substrate to be suppressed to remove foreign substances. The cleaning or production method according to the present invention is effective particularly because enabling the roughness of the nitrogen-polar face to be suppressed. Normally, an aluminum-polar face is used as a crystal growth face for an aluminum nitride single crystal layer when, for example, an aluminum nitride single crystal substrate is used among group III nitride single crystal substrates as a base, and the aluminum nitride single crystal layer is layered over this base substrate by chemical vapor deposition. Therefore, concerning the aluminum-polar face of the base substrate, which is a crystal growth face, the smoothness of the surface of the aluminum-polar face is important for obtaining a high-quality aluminum nitride single crystal layer, and thus, foreign substances are removed. Meanwhile, stains on and the smoothness of the nitrogen-polar face, which is not used as a crystal growth face, have not been regarded as important in particular so far. In the cleaning method according to this embodiment, cleaning the nitrogen-polar face of the group III nitride single crystal substrate with a detergent including a fluoroorganic compound enables the roughness of the nitrogen-polar face to be suppressed to remove foreign substances. The cleaning method according to this embodiment is characterized in that the cleaning method is carried out on the nitrogen-polar face of the group III nitride single crystal substrate, but can be also carried out on the group III element-polar face. When carried out on the group III element-polar face, this cleaning method enables the roughness of the surface of the group III element-polar face to be suppressed to remove foreign substances. Hereinafter the cleaning method according to the present invention will be described.

[Group III Nitride Single Crystal Substrate]

The group III nitride single crystal substrate used in the cleaning method according to this embodiment is not particularly limited, and specific examples thereof include a gallium nitride single crystal substrate, an aluminum nitride single crystal substrate, an indium nitride single crystal substrate, and an aluminum gallium nitride single crystal substrate. The cleaning method according to this embodiment is preferably used for an aluminum nitride single crystal substrate having a nitrogen-polar face that tends to be rough in particular among those group III nitride single crystal substrates. For these group III nitride single crystal substrates, any group III nitride single crystal substrates produced by a known method such as the aforementioned HVPE and a sublimation method can be used without restrictions. Among the methods of producing group III nitride single crystal substrates, HVPE is a method of supplying a group III raw material gas such as an aluminum trichloride gas, and a group V raw material gas such as ammonia to the top of a base substrate formed from a group III nitride single crystal substrate, and layering a group III nitride single crystal layer by a vapor phase epitaxy method. A single crystal substrate of a desired thickness which is cut out by a known grinding means such as a wire saw from an ingot-shaped thick single crystal that is generally obtained by a sublimation method can be also used. In the production method according to the present invention, the group III element-polar face and/or the nitrogen-polar face of the group III nitride single crystal substrate produced by the foregoing, which is/are polished to be super-flat by CMP or the like is/are preferably used. Particularly, while inorganic and organic foreign substances derived from an abrasive, an adhesive, etc. used in the polishing may remain on the group III nitride single crystal substrate polished by CMP, the production method according to the present invention enables these foreign substances to be effectively removed with the smoothness of the group III nitride single crystal substrate maintained, which leads to more notable exertion of the effects of the present invention.

Either one or both of the group III element-polar face and the nitrogen-polar face of the group III nitride single crystal substrate may be polished by CMP or the like. The cleaning method according to this embodiment enables the roughness of the nitrogen-polar face to be suppressed to effectively remove foreign substances, which leads to more notable exertion of the effects of the present invention on a group III nitride single crystal substrate having both a group III element-polar face and a nitrogen-polar face processed to be super-flat.

The shape of the group III nitride single crystal substrate in a top view may be any of a round, a quadrangular, or an indefinite shape; and the area thereof is preferably 100 to 10000 $mm^2$. When having a round shape, the group III nitride single crystal substrate preferably has a diameter of 1 inch (25.4 mm) or more, and further preferably has a diameter of 2 inches (50.8 mm) or more. The thickness of the group III nitride single crystal substrate may be determined within such a range as not to lead to breakage due to insufficient strength. Specifically, the thickness of the group III nitride single crystal substrate may be 50 to 2000 μm, and is further preferably 100 to 1000 μm.

<Aluminum Nitride Single Crystal Substrate>

As an example, hereinafter an aluminum nitride single crystal substrate particularly among group III nitride single crystal substrates will be described in detail with FIG. 1. The aluminum nitride single crystal substrate is one example of the "group III nitride single crystal substrate" according to the present invention. As described above, the "group III nitride single crystal substrate" according to the present invention is not limited to the aluminum nitride single crystal substrate.

FIG. 1 is a side view schematically showing the aluminum nitride single crystal substrate according to one embodiment of the present invention taken in the crystal growth direction. FIG. 1 is schematically drawn for describing the structure of the aluminum nitride single crystal substrate, and the ratio of the dimensions of the components does not necessarily correspond to that of any actual aluminum nitride single crystal substrate.

As shown in FIG. 1, an aluminum nitride single crystal substrate 1 according to one embodiment of the present invention includes a substrate formed from an aluminum nitride single crystal to be used as a base (hereinafter also referred to as "base substrate") 10, and an aluminum nitride single crystal layer 20 layered over the base substrate 10.

The base substrate 10 has an aluminum-polar face (also referred to as a (001) face or c face) 10a, and a nitrogen-polar face (also referred to as a (00–1) face or –c face) 10b opposite the aluminum-polar face 10a.

The aluminum nitride single crystal layer 20 has a structure of layering plural aluminum nitride single crystal thin films 22. Specifically, the aluminum nitride single crystal layer 20 has a structure of layering the aluminum nitride single crystal thin films 22 by crystal growth of the thin films 22 over the aluminum-polar face 10a of the base substrate 10 as a crystal growth face. As well as the base substrate 10, the aluminum nitride single crystal layer 20 has an aluminum-polar face (a (001) face or c face) 20a, and a nitrogen-polar face (a (00–1) face or –c face) 20b opposite the aluminum-polar face 20a. In the base substrate 10, a face over which the aluminum nitride single crystal layer 20 is grown is not necessarily limited to, but is preferably the aluminum-polar face 10a because a stable free-standing substrate (described later) can be produced.

The aluminum-polar face 20a of the aluminum nitride single crystal layer 20, and the nitrogen-polar face 10b of the base substrate 10 form an aluminum-polar face 1a and a nitrogen-polar face 1b of the aluminum nitride single crystal substrate 1, respectively. That is, the aluminum nitride single crystal substrate 1 has the aluminum-polar face 1a, and the nitrogen-polar face 1b opposite this aluminum-polar face.

The "group III nitride single crystal substrate" according to the present invention encompasses not only the aluminum nitride single crystal substrate 1 itself, but also both the simple base substrate 10 separated from the aluminum nitride single crystal substrate 1, and the aluminum nitride single crystal layer 20 produced as a substrate of an aluminum nitride semiconductor device by separating the base substrate from the aluminum nitride single crystal substrate 1 (hereinafter also referred to as "free-standing substrate"). When the "group III nitride single crystal substrate" is the aluminum nitride single crystal substrate 1 itself, the "nitrogen-polar face" according to the present invention shall refer to the nitrogen-polar face 1b of the aluminum nitride single crystal substrate 1; when the "group III nitride single crystal substrate" is the simple base substrate 10, the "nitrogen-polar face" according to the present invention shall refer to the nitrogen-polar face 10b of the base substrate 10, and when the "group III nitride single crystal substrate" is the free-standing substrate formed of the aluminum nitride single crystal layer 20, the "nitrogen-polar face" according to the present invention shall refer to the nitrogen-polar face 20b of the aluminum nitride single crystal layer 20.

In the following description, a general term for the aluminum nitride single crystal substrate 1, the base substrate 10, and the free-standing substrate formed of the aluminum nitride single crystal layer 20 is simply expressed by an "aluminum nitride single crystal substrate" with a reference sign omitted; a general term for the aluminum-polar faces 1a, 10a and 20a of the aluminum nitride single crystal substrate 1, the base substrate 10, and the free-standing substrate formed of the aluminum nitride single crystal layer 20, respectively, is simply expressed by an "aluminum-polar face" with a reference sign omitted; and a general term for the nitrogen-polar faces 1b, 10b and 20b thereof is simply expressed by a "nitrogen-polar face" with a reference sign omitted. The aluminum-polar face is one example of the "group III element-polar face" according to the present invention.

For example, among these aluminum nitride single crystal substrates, when a substrate formed from an aluminum nitride single crystal is used as a base, and the aluminum nitride single crystal layer 20 is layered over this base substrate 10 by chemical vapor deposition, the aluminum nitride single crystal substrate 1 may have a thickness within the range of 50 and 2000 μm, and further preferably has a thickness within the range of 100 and 1000 μm as described above.

The aluminum-polar face of the aluminum nitride single crystal substrate is not especially limited, but preferably, an atomic step is observed in a field of approximately 1 μm×1 μm thereof by observation by means of an atomic force microscope or a scanning probe microscope. Further, the root mean square roughness (Rq) of the aluminum-polar face is preferably 0.05 to 0.5 nm. The radius of curvature of the shape of the aluminum-polar face of the aluminum nitride single crystal substrate is not specifically limited, either, but is preferably within the range of 0.1 and 10000 m.

The nitrogen-polar face of the aluminum nitride single crystal substrate is not particularly limited other than the above. However, the smaller the arithmetic-mean roughness Ra (hereinafter also referred to as "mean roughness (Ra)") of the nitrogen-polar face is, the better. For example, this mean roughness (Ra) is preferably at most 4.0 nm, and more preferably at most 2.5 nm. The lower limit of this mean roughness (Ra) is most preferably near 0. Specifically, in view of industrial production, the lower limit of this mean roughness (Ra) is 0.05 nm. That is, the mean roughness (Ra) of the nitrogen-polar face of the aluminum nitride single crystal substrate is preferably 3.0 nm to 4.0 nm, and more preferably 0.05 nm to 2.5 nm.

These root mean square roughness (Rq) and mean roughness (Ra) can be also obtained from observation of one field range (58800 μm² (280 μm×210 μm)) when measured by means of a white-light interferometric microscope with an object lens with a magnifying power of 50, other than the measuring method by the aforementioned observation by means of an atomic force microscope or scanning probe microscope. These root mean square roughness (Rq) and mean roughness (Ra) are more preferably measured after foreign substances and contaminants on the face to be observed are removed. Here, the mean roughness (Ra) is a value averaged from the absolute values of the differences between the respective altitudes of the surface measured at predetermined intervals from one to the other end points of a reference line that is obtained by extracting a line segment of 280 μm in length which is parallel to one long side among four sides constituting the aforementioned one field range (280 μm×210 μm), and the average value of these altitudes in the range of the reference line (the differences represented where the position is a valuable are also represented as a roughness curve). The root mean square roughness (Rq) represents standard deviation of the surface roughness, and specifically, is a square root of the average value of the squared roughness curve from one to the other end points of the reference line. The root mean square roughness (Rq) of the aluminum-polar face, and the mean roughness (Ra) of the nitrogen-polar face can be adjusted not only by CMP polishing, but also by mechanical polishing with a metal surface plate, and a diamond particle having a particle size of approximately 0.1 to 10 μm.

The radius of curvature of the shape of the nitrogen-polar face of the aluminum nitride single crystal substrate is not specifically limited, either, but is preferably the same as that of the aluminum-polar face, and specifically, is preferably within the range of 0.1 and 10000 m.

[Detergent]

A feature of the cleaning method according to this embodiment is to use a detergent including a fluoroorganic compound for cleaning the nitrogen-polar face of the aluminum nitride single crystal substrate.

<Major Component: Fluoroorganic Compound>

The detergent used in one embodiment of the present invention (hereinafter also referred to as "this detergent") includes a fluoroorganic compound. This fluoroorganic compound includes a compound obtained by substituting a fluorine atom for some hydrogen atom(s) of a hydrocarbonaceous compound or an etheric compound. As this fluoroorganic compound, particularly, hydrofluorocarbon (HFC) obtained by substituting a fluorine atom alone for some hydrogen atom(s) of a hydrocarbonaceous compound, hydrofluoroether (HFE) obtained by substituting a fluorine atom alone for some hydrogen atom(s) of an etheric compound, or the like can be used. A hydrocarbonaceous compound that is the original before the substitution and corresponds to the aforementioned hydrofluorocarbon may be a saturated or unsaturated hydrocarbon compound. For the fluoroorganic compound, HFC may be used alone, HFE may be used alone, or HFC and HFE may be used in combination.

(Hydrofluorocarbon: HFC)

The fluoroorganic compound is preferably hydrofluorocarbon, and among hydrofluorocarbons, is more preferably a compound represented by the following formula (1), that is, a compound obtained by substituting a fluorine atom alone for some hydrogen atom(s) of saturated hydrocarbon.

$$C_nH_{2n+2-m}F_m \tag{1}$$

In the formula (1), n is an integer of 2 to 8, and m is an integer satisfying $3 \leq m \leq 2n+2$: n is preferably an integer of 4 to 6, and m is preferably $5 \leq m \leq 2n$. Specific examples of HFC represented by the formula (1) include 1H,2H-perfluorobutane, 1H,3H-perfluorobutane, 1H,4H-perfluorobutane, 2H,3H-perfluorobutane, 4H,4H-perfluorobutane, 1H,1H,3H-perfluorobutane, 1H,1H,4H-perfluorobutane, 1H,2H,3H-perfluorobutane, 1H,1H,4H-perfluorobutane, 1H,2H,3H-perfluorobutane, 2H,2H,4H,4H,4H-perfluorobutane (HFC365mfc), 1H,2H-perfluoropentane, 1H,4H-perfluoropentane, 2H,3H-perfluoropentane, 2H,4H-perfluoropentane, 2H,5H-perfluoropentane, 1H,2H,3H-perfluoropentane, 1H,3H,5H-perfluoropentane, 1H,5H,5H-perfluoropentane, 2H,2H,4H-perfluoropentane, 1H,2H,4H,5H-perfluoropentane, 1H,4H,5H,5H,5H-perfluoropentane, 1H-perfluorohexane (HFC-52-13p), 1H,2H-perfluorohexane, 2H,3H-perfluorohexane, 2H,4H-perfluorohexane, 2H,5H-perfluorohexane, 3H,4H-perfluorohexane, 1H,1H,1H,2H,2H-perfluorohexane, and 1H,1H,1H,2H,2H-perfluorooctane (HFC-76-13sf).

HFC is not limited to compounds obtained by substituting a fluorine atom alone for some hydrogen atom(s) of saturated hydrocarbon which are represented by the formula (1), but may be any compound obtained by substituting a fluorine atom alone for some hydrogen atom(s) of unsaturated hydrocarbon ("hydrofluoroolefin (HFO)"). Specific examples of HFO include 2,2,3,3-tetrafluoro-1-propene (HFO-1234yf).

Among them, 2H,2H,4H,4H,4H-perfluorobutane (HFC365mfc) is particularly preferable for hydrofluorocarbon herein. Among the aforementioned specific examples, one hydrofluorocarbon may be used alone, or plural hydrofluorocarbons may be used in combination. When 2H,2H,4H,4H,4H-perfluorobutane is used as hydrofluorocarbon herein, the higher the content of 2H,2H,4H,4H,4H-perfluorobutane in hydrofluorocarbon to be used is, the more preferable. For example, this content may be 90% to 100% in mass concentration.

(Hydrofluoroether: HFE)

Specific examples of hydrofluoroether herein include methyl perfluorobutyl ether, methyl perfluoroisobutyl ether, methyl perfluoropentyl ether, methyl perfluorocyclohexyl ether, ethyl perfluorobutyl ether, ethyl perfluoroisobutyl ether, ethyl perfluoropentyl ether, and 1,1,2,2-tetrafluoroethyl2,2,2-trifluoroethyl ether (HFE-347pcf2).

(Other Fluoroorganic Compounds)

The fluoroorganic compound herein is not limited to compounds obtained by substituting a fluorine atom alone, but may encompass compounds obtained by further substituting another atom (for example, a halogen atom such as a chlorine atom) for some hydrogen atom(s) of a hydrocarbonaceous compound or an etheric compound. As one example, the fluoroorganic compound may encompass 1-chloro-2,3,4-trifluoro-1-propene (HCFO-1233yd).

<Optional Components>

The detergent used in the cleaning method according to this embodiment may include any other component as an optional component in addition to the fluoroorganic compound. Examples of the optional component include the following glycol ether compounds and hydrocarbon compounds. They are examples. The optional component is not limited to them. The detergent may include any other component unless deviating from the purpose of the present invention.

(Glycol Ether Compound)

Examples of a glycol ether compound herein include glycol ether monoalkyl ether-based compounds, and glycol ether dialkyl ether-based compounds. They are classified into hydrophilic and hydrophobic compounds. Among glycol ether monoalkyl ether-based compounds and glycol ether dialkyl ether-based compounds, one may be used alone, or plural ones may be used in combination.

Glycol Ether Monoalkyl Ether-Based Compound

The glycol ether monoalkyl ether-based compound is a compound obtained by substituting a hydrocarbon residue, or a hydrocarbon residue including an ether bond for hydrogen of one of two hydroxyl groups of an aliphatic or alicyclic compound having two carbon atoms and the two hydroxyl groups bonded to the two carbon atoms, respectively.

Specific examples of hydrophilic glycol ether monoalkyl ether herein include 3-methoxybutanol, 3-methoxy-3-methylbutanol, ethylene glycol monobutyl ether, diethylene glycol monomethyl ether, diethylene glycol monoethyl ether, diethylene glycol mono-i-propyl ether, diethylene glycol monopropyl ether, propylene glycol monomethyl ether, dipropylene glycol monomethyl ether, tripropylene glycol monomethyl ether, and diethylene glycol monobutyl ether. Among them, ethylene glycol monobutyl ether is preferable.

Specific examples of hydrophobic glycol ether monoalkyl ether herein include propylene glycol monobutyl ether, ethylene glycol monohexyl ether, dipropylene glycol monobutyl ether, and dipropylene glycol monopropyl ether.

Among them, the glycol ether monoalkyl ether-based compound may include one alone, or plural ones in combination, but preferably includes ethylene glycol monobutyl ether.

The content of the glycol ether monoalkyl ether-based compound is preferably 1 to 10% of the total detergent in mass concentration. Particularly, when diethylene glycol monobutyl ether is used as the glycol ether monoalkyl ether-based compound, the content of this diethylene glycol monobutyl ether is preferably 1 to 10% of the total detergent in mass concentration.

Glycol Ether Dialkyl Ether-based Compound

The glycol ether dialkyl ether-based compound is a compound obtained by substituting a hydrocarbon residue, or a hydrocarbon residue including an ether bond for hydrogen of both of two hydroxyl groups of an aliphatic or alicyclic compound having two carbon atoms and the two hydroxyl groups bonded to the two carbon atoms, respectively.

Specific examples of hydrophilic glycol ether dialkyl ether herein include diethylene glycol dimethyl ether, diethylene glycol diethyl ether, and tetraethylene glycol dimethyl ether. Specific examples of hydrophobic glycol ether dialkyl ether herein include dipropylene glycol dimethyl ether, and diethylene glycol dibutyl ether. Among them, the glycol ether dialkyl ether-based compound may include one alone, or plural ones in combination.

(Hydrocarbon Compound)

Specific examples of a hydrocarbon compound herein include pentane, 2,2-dimethylbutane, 2,3-dimethylbutane, 2-methylpentane, n-hexane, isohexane, cyclohexane, 2-methylhexane, 3-methylhexane, 2,2,5-trimethylhexane, cyclohexene, heptane, isooctane, 2-methylpentane, 2,4-dimethylpentane, 2,2,3-trimethylpentane, octane, isooctane, nonane, decane, undecane, dodecane, tridecane, tetradecane, pentadecane, menthane, bicyclohexyl, cyclododecane, and 2,2,4,4,6,8,8-heptamethylnonane.

Among these components, one kind may be included alone, or plural kinds may be included in combination.

(Other Optional Components)

Other than the aforementioned optional components, for example, an antioxidant, an UV absorber, a surfactant, a stabilizer, a defoaming agent, and/or an alcohol which may be known one(s) may be included if necessary. As an alcohol, for example, methanol, ethanol, 2-propanol, or 2,2,2-trifluoroethanol may be included.

<Properties>

The major properties of this detergent are preferably as follows.

(Specific Gravity)

This detergent is formed from the fluoroorganic compound as a major component, and at least one selected from the group consisting of the glycol ether compound and the hydrocarbon compound as optional components. The specific gravity of this detergent can be adjusted by the content ratio of these components. For example, the higher the content ratio of the fluoroorganic compound is, the higher the specific gravity of the detergent is; and the lower the content ratio of the fluoroorganic compound is, the lower the specific gravity of the detergent is.

The specific gravity of the detergent at 25° C. is most preferably near 1.02. When this specific gravity at 25° C. is greatly higher than 1.02, the content of the fluoroorganic substance is high, and thus, the content of the component suitable for cleaning organic foreign substances is relatively low, which leads to a tendency towards decrease in the detergency of the detergent. When this specific gravity at 25° C. is greatly lower than 1.02, stain components taken into a cleaning liquid may be accumulated, which leads to a tendency towards decrease in the detergency. In view of industrial production, the specific gravity of this detergent at 25° C. may be 0.80 to 1.28, and is preferably 0.90 to 1.20, more preferably 1.00 to 1.14, and further preferably 1.01 to 1.06.

For example, the specific gravity of the detergent can be managed by managing the rate of change in the composition of the aforementioned glycol ether compound, which is an optional component. More specifically, the specific gravity of the detergent can be managed by managing the boiling point of the detergent by the use of a large difference between the fluoroorganic compound, which is a major component, and the glycol ether compound in boiling point (described later). The rate of change in the composition of the glycol ether compound is the proportion at which the composition of the glycol ether compound changes: specifically, is the proportion of the difference between the content of the glycol ether compound in the total detergent at a predetermined timing that is the basis (for example, the timing when the detergent is produced, and the timing when the detergent is started using) (hereinafter also referred to as "first content"), and the content of the glycol ether compound in the total detergent at the present (hereinafter also referred to as "second content") to the first content ("first content−second content"/"first content"). "Present" means the timing when the detergent is presently used. For example, the content of the glycol ether compound in the total detergent can be measured by the use of a known method such as gas chromatography.

Preferably, the rate of change in the composition of the glycol ether compound is preferably managed to be within ±10%. Managing the rate of change in the composition of the glycol ether compound to be within ±10% enables the specific gravity of the detergent at 25° C. to be adjusted to 1.02 to 1.28. Specifically, when the rate of change in the composition of the glycol ether compound approaches −10%, the specific gravity of the detergent at 25° C. approaches 1.28; and when the rate of change in the composition of the glycol ether compound approaches +10%, the specific gravity of the detergent at 25° C. approaches 1.02.

(Boiling Point)

The boiling point of this detergent may be 35° C. to 65° C., is preferably 40° C. to and is more preferably 47° C. to 58° C. Here, the boiling point is the temperature of a liquid phase in reflux. As well as the specific gravity, the boiling point of this detergent can be adjusted by the content ratio of the aforementioned components. Specifically, the boiling point of this detergent can be managed by managing the rate of change in the composition of the glycol ether compound. More specifically, the rate of change in the composition of the glycol ether compound approaching −10% can cause the boiling point to approach 47° C.; and the rate of change in the composition of the glycol ether compound approaching +10% can cause the boiling point to approach 58° C.

<Content Ratio>

The content ratio of the aforementioned components is not particularly limited, but can be adjusted, as appropriate, according to foreign substances to be removed, the quantity of the foreign substances, etc.

In order to improve detergency for the nitrogen-polar face of the aluminum nitride single crystal substrate, and in order not to roughen the nitrogen-polar face, the fluoroorganic compound, which is a major component, has only to be the highest content compared with the other components. Specifically, the content of the fluoroorganic compound may be at least 20%, and is preferably at least 40%, and more preferably at least 50% of the detergent in mass concentration.

<Amount to be Used>

The amount of the detergent to be used is not particularly limited. The amount of the detergent to be used in cleaning may be adjusted so that the entire group III nitride single crystal substrate to be cleaned will be immersed in the detergent. Preferably, this amount to be used is adjusted so that the entire group III nitride single crystal substrate can be continuously immersed during cleaning even when the detergent volatilizes during the cleaning. In contrast, for reducing the impact on the environment, the amount to be used is preferably small.

In view of the foregoing, the amount of the detergent to be used may be determined as appropriate in view of a type and the number of the substrate(s) to be cleaned, the size of a container, etc. For example, preferably 10 ml to 500 ml, more preferably 50 ml to 200 ml of the detergent is used for one aluminum nitride single crystal substrate 1 having an outer diameter of 48.5 mm.

Specific Examples

Preferred specific examples of this detergent include Elnova (registered trademark) V3 (manufactured by TOKUYAMA METEL Corporation). Elnova (registered trademark) V3 is a detergent including, as the components, 2H,2H,4H,4H,4H-perfluorobutane, which is the fluoroorganic compound, ethylene glycol monobutyl ether, which is the glycol ether compound, at least one glycol ether compound other than this ethylene glycol monobutyl ether, and at least one hydrocarbon compound. The specific gravity of Elnova (registered trademark) V3 at 25° C. is 1.02±0.005, the boiling point thereof is 54±0.5° C., and the saturated water content thereof is 1.0% to 5.0%.

[Method of Cleaning Group III Nitride Single Crystal Substrate]

Hereinafter the method of cleaning the aluminum nitride single crystal substrate that is one embodiment of the group III nitride single crystal substrate will be described.

The method of cleaning the aluminum nitride single crystal substrate according to the present embodiment is carried out by immersing the aluminum nitride single crystal substrate in the foregoing detergent. When the saturated water content of the detergent is at most 10%, preferably, moisture adhering to the aluminum nitride single crystal substrate is removed in advance for properties of the detergent. For example, the method of immersing the aluminum nitride single crystal substrate in the detergent may be carried out by putting the detergent and the aluminum nitride single crystal substrate in a container having a predetermined size. For reducing the amount of the detergent to be used, a predetermined amount of water may be further used around a bottle containing the detergent in this container by indirect cleaning.

As the detergent, the foregoing detergent including the fluoroorganic compound is used. It is not necessary to use one detergent including the fluoroorganic compound. For example, a plurality of the following cleaning liquids may be used in combination. Specifically, a detergent obtained by adjusting pH of a commercially available acidic or alkaline cleaning liquid to be within a desired range, or a neutral liquid such as ultrapure water, acetone, isopropyl alcohol, and a hydrocarbon may be used in combination with the detergent including the fluoroorganic compound.

The nitrogen-polar face of aluminum nitride tends to be inferior in chemical stability as compared with the aluminum-polar face thereof. The surface of the nitrogen-polar face tends to be etched with the aforementioned acidic or alkaline detergent. It is difficult to remove, by the use of ultrapure water, acetone, or isopropyl alcohol, foreign substances adhered in the grinding polishing step, a renewing polishing step, and a repetition step. Thus, in the present invention, the detergent including the fluoroorganic compound is used as a cleaning liquid for cleaning the nitrogen-polar face without the nitrogen-polar face roughening.

For reducing the impact on the environment, the detergent including the fluoroorganic compound is preferably used in a nonvolatilized form. As one example of this form, this detergent is preferably used at a certain temperature or lower. Specifically, the temperature (liquid temperature) of the detergent when the aluminum nitride single crystal substrate is immersed in the detergent may be 10° C. to 70° C., and is preferably 25° C. to 60° C., more preferably 30° C. to 55° C., and further preferably 40° C. to 50° C.

The time for which the aluminum nitride single crystal substrate is immersed in the detergent (hereinafter also referred to as "immersing time") may be set as appropriate so that foreign substances can be removed. For example, this time may be 5 minutes to 1 hour, and preferably 15 to 40 minutes.

The detergent, in which the aluminum nitride single crystal substrate is immersed, is preferably irradiated with an ultrasonic wave. The frequency of the ultrasonic wave may be 30 kHz to 100 kHz, and for example, can be 40 kHz. The irradiating time with the ultrasonic wave may be adjusted as appropriate within the foregoing immersing time.

For example, an ultrasonic cleaner may be used for immersing the aluminum nitride single crystal substrate in the detergent during the irradiation with the ultrasonic wave by, specifically, putting a predetermined amount of water therein, putting, in the water, a covered bottle (for example, a screw bottle) containing the detergent and the aluminum nitride single crystal substrate, and irradiating the detergent with the ultrasonic wave. The cleaning method is not limited to ultrasonic wave cleaning, but any other known method such as immersion cleaning, heat cleaning, and steam cleaning may be used.

By the foregoing, both the nitrogen-polar face and the aluminum-polar face of the aluminum nitride single crystal substrate can be cleaned by the use of the detergent including the fluoroorganic compound. After cleaned by the use of the detergent, the aluminum nitride single crystal substrate can be subjected to the next step after the detergent etc. adhered to the surface are removed by drying or the like.

The cleaning may include plural stages. In one embodiment of the present invention, the cleaning includes two stages. In the first stage, the group III nitride single crystal substrate is cleaned with the detergent according to the present invention. In the second stage, the group III nitride single crystal substrate, on which the cleaning at the first stage is completed, is further cleaned with a rinse agent having a higher content of the fluoroorganic compound than the detergent used at the first stage. In other words, at the first stage, the group III nitride single crystal substrate is cleaned with the detergent; and at the second stage, the group III nitride single crystal substrate, on which the cleaning at the first stage is completed, is further cleaned with a rinse agent having a higher specific gravity than the detergent at the first stage.

That is, after the cleaning method, the step of rinsing the detergent, drops, and/or components to cause stains (hereinafter also referred to as "rinsing step") may be performed when they adhere to the surface of the group III nitride single crystal substrate. In this rinsing step, a rinse agent excellent in evaporative drying performance is preferably used for rinsing the surface of the group III nitride single crystal substrate. In this rinsing step, the rinsing can be performed by the use of a known means such as immersion cleaning and steam cleaning. Among these means, steam cleaning that enables stains on the surface of an object to be cleaned to be further reduced is preferable. When stain stands out, prewashing by immersion cleaning or the like is preferable.

As the rinse agent, a rinse agent including the same components as the detergent may be used, any other rinse agent such as acetone may be used, or any combination thereof may be used. Or, the rinsing may be performed plural times with the same one or plural ones in combination among these rinse agents.

When the same components as the detergent are used for the rinse agent, the content ratio of the rinse agent may be different from that of the detergent used in the cleaning step. The larger the content of the fluoroorganic compound in the total rinse agent is, the more the evaporativity and a drying property can be improved. Specifically, the content of the fluoroorganic compound in the total rinse agent is preferably at least 50 mass %, more preferably at least 55 mass %, and further preferably at least 60 mass %.

In view of easy drying, and effective suppression of remaining on the surface of the group III nitride single crystal substrate, preferably, the boiling point of the rinse agent is lower than that of the detergent; specifically, is preferably at least 40° C. and lower than 47° C.

Preferred specific examples of this rinse agent include Elnova (registered trademark) VR3 (manufactured by TOKUYAMA METEL Corporation). Elnova (registered trademark) VR3 includes the fluoroorganic compound same as the component of the aforementioned Elnova (registered trademark) V3. The content of this fluoroorganic compound in Elnova (registered trademark) VR3 is higher than that in Elnova (registered trademark) V3; specifically, is at least 99%. The specific gravity of Elnova (registered trademark) VR3 at 25° C. is 1.27±0.005, the boiling point thereof is 40±0.5° C., and the saturated water content thereof is 900±90 ppm.

[Method of Producing Group III Nitride Single Crystal Substrate 1]

The method of producing the group III nitride single crystal substrate according to one embodiment of the present invention includes: the polishing step of using a substrate formed from a group III nitride single crystal as a base substrate 10 to deposit a group III nitride single crystal layer over the group III element-polar face of the group III nitride single crystal substrate by a vapor phase epitaxy method, and thereafter, polishing at least the nitrogen-polar face; and the cleaning step of cleaning the nitrogen-polar face by the method of cleaning the group III nitride single crystal substrate. Hereinafter, with the aluminum nitride single crystal substrate 1 as an example of the group III nitride single crystal substrate, each of the steps according to the production method thereof will be described in detail with reference to FIG. 1 again.

[Method of Producing Aluminum Nitride Single Crystal Substrate]

<Preparation Step>

When the base substrate 10 formed from an aluminum nitride single crystal is grown by a sublimation method, a seed substrate that is the basis of the base substrate is fixed on one side of a crucible for growth which is disposed inside a reactor, and an aluminum nitride polycrystal raw material is disposed on the opposite side of the seed substrate. The polycrystal raw material is vaporized by a temperature gradient given on the seed substrate side and on the raw material side in a nitrogen atmosphere to deposit an aluminum nitride single crystal over the seed substrate. As the material of the crucible, tungsten, tantalum carbide, or the like is generally used. The growth temperature is within the range of 1800° C. and 2300° C. The pressure in the reactor is controlled to be in the range of 100 Torr and 1000 Torr. An aluminum nitride polycrystal raw material that was subjected to refining operation of removing impurities by using the effects of sublimation and recrystallization in advance is preferably used. An aluminum nitride single crystal boule deposited as a result of the foregoing is sliced, ground, and polished to obtain the base substrate 10.

(Growth Step of Aluminum Nitride Single Crystal Layer 20)

The means for forming the aluminum nitride single crystal layer 20 over the aluminum-polar face 10*a* of the base substrate 10 is not particularly limited as long as being a vapor phase epitaxy method. Any known vapor phase epitaxy method can be employed. Specific examples of the vapor phase epitaxy method herein include HVPE, MOCVD, and MBE.

The aluminum nitride single crystal layer 20 is grown by HVPE by: supplying an aluminum halide gas that is a raw material gas, and a nitrogen source gas to the top of the heated base substrate 10 in a reactor in a state where the gases are each diluted by a carrier gas; and reacting both the gasses on the heated base substrate 10. As the aluminum halide gas, a gallium chloride gas, an aluminum chloride gas, or the like is preferably used. The aluminum halide gas can be obtained by bringing high-purity aluminum having a purity of 99.9999% or more, and a high-purity hydrogen chloride gas or high-purity chlorine gas having a purity of 99.999% or more into contact with each other. As the nitrogen source gas, an ammonia gas is preferably used. As the carrier gas, any known gas such as hydrogen, nitrogen, argon, and helium which has a dew point controlled to be −110° C. or lower and from which moisture is removed can be preferably used. A hydrogen halide gas such as hydrogen chloride is also allowed to coexist, as appropriate, with each of the raw material gases. The heating temperature of the base substrate 10, the supply amounts of the aluminum halide gas and the nitrogen source gas, and the linear velocities of the supplied gasses are factors affecting the crystal growth rate, and may be determined, as appropriate, according to the desired crystal growth rate. When an aluminum nitride single crystal is grown as the group III nitride single crystal, the temperature of the base substrate is normally within the range of 1200° C. and 1800° C., more preferably within the range of 1350° C. and 1700° C., and further preferably within the range of 1450° C. and 1600° C. When a gallium nitride single crystal is grown as the group III nitride single crystal, the heating temperature of the base substrate is normally within the range of 900° C. and 1600° C., and more preferably within the range of 1000° C. and 1200° C. As the heating means for the base substrate 10, any known heating means such as resistance heating, high-frequency induction heating, and optical heating can be used. Among these heating means, one may be used alone, or plural ones may be used in combination.

The supply amount of the aluminum halide gas, which is a raw material gas, is within the range of 0.001 sccm and 500 sccm; and the supply amount of the nitrogen source gas is within the range of 0.01 sccm and 5000 sccm. For arranging the gas flows inside the reactor, it is effective to dispose a dry pump on the downstream side of a device to keep the pressure inside the reactor fixed, or to promote discharge from the reactor. The growth is performed under the condition that the pressure inside the reactor is within the range of 100 Torr and 1000 Torr, more preferably within the range of 360 Torr and 760 Torr.

Too thin a thickness of the layered aluminum nitride single crystal layer 20 may lead to a thin free-standing substrate formed of the aluminum nitride single crystal layer 20 which is to be obtained in the undermentioned processing or separation step, or may cause the free-standing substrate to disappear. Therefore, the thickness of the aluminum nitride single crystal layer 20 is preferably at least 100 µm, more preferably 200 to 1500 µm, and further preferably 300 to 1200 µm.

When it is necessary to control the electroconductivity of the aluminum nitride single crystal layer 20, the aluminum nitride single crystal layer 20 can be grown while impurities (such as a compound including Si, Mg, S, or the like) that properly serve as a donor or an acceptor are supplied.

<Processing and Polishing Step>

The base substrate 10, or the aluminum nitride single crystal substrate 1 obtained by layering the aluminum nitride single crystal layer 20 over the base substrate can be used as a substrate of an aluminum nitride semiconductor device by subjecting both the aluminum-polar face 10a or 1a and the nitrogen-polar face 10b or 1b, or the aluminum-polar face 10a or 1a alone to mirror finishing by grinding and CMP polishing or the like. The aluminum nitride single crystal substrate 1 is separated into the base substrate 10 and the layered aluminum nitride single crystal layer 20. This separated aluminum nitride single crystal layer 20 can be used as a free-standing substrate for the foregoing aluminum nitride device. Further, the base substrate 10 after the separation can be reused as the base substrate 10 for layering an aluminum nitride single crystal by processing the separated surface to be a super-flat face by CMP polishing. For the method of iteratively reusing the base substrate 10, for example, the method disclosed in WO 2017/164233 A1 can be employed.

Any known methods can be employed for the methods of grinding, and chemical mechanical planarization (CMP). For example, one may fix the aluminum nitride single crystal substrate onto a plate of, for example, a ceramic with adhesive or wax, or tape or the like, and apply pressure to and polish the aluminum nitride single crystal substrate during rotation thereof on a nonwoven fabric or a polishing pad to which a slurry is dropped. The tape is not particularly limited, but for example, a thermal release tape is preferably used in view of easy releasability by heat treatment or the like. The wax is not particularly limited, but for example, a solid or liquid wax is preferably used in view of easy positioning of the substrate in an adhering operation, and easy releasability with solvent or the like. As an abrasive used herein, any abrasive including a material such as silica, alumina, ceria, silicon carbide, boron nitride, and diamond can be used. The properties of the abrasive may be alkaline, neutral, or acidic. Among them, since the alkali resistance of a nitrogen-polar face of aluminum nitride is low, a weakly alkaline, neutral, or acidic abrasive, specifically an abrasive of pH 9 or less is more preferably used than a strong alkaline abrasive. A strong alkaline abrasive can be used of course without any problem when a protection film is disposed on the nitrogen-polar face. An additive such as an oxidizing agent can be added for improving the polishing rate. A polishing pad of the material and the hardness same as a commercially available one can be used.

<Method of Iteratively Reusing Base Substrate 10>

The method of iteratively reusing the base substrate 10 obtained by the foregoing production method includes the following steps.

The growth step of growing the aluminum nitride single crystal layer 20 over the base substrate 10 formed from the aluminum nitride single crystal to obtain the aluminum nitride single crystal substrate 1; the separation step of cutting the aluminum nitride single crystal layer 20 of the aluminum nitride single crystal substrate 1 to separate the aluminum nitride single crystal substrate 1 into the base substrate 10 including the thin films 22, which are at least part of the aluminum nitride single crystal layer 20 and are layered thereover, and the aluminum nitride single crystal layer 20; the renewing polishing step of polishing the surface of the thin films 22 of the base substrate, over which the thin films 22 are layered; and the repetition step of using a base substrate obtained in the renewing polishing step as a renewed base substrate to grow an aluminum nitride single crystal over the surface of a polished surface of this base substrate.

<Separation Step>

The separation step is to cut the aluminum nitride single crystal 1 obtained in the growth step to separate the aluminum nitride single crystal substrate 1 into the base substrate 10 formed from an aluminum nitride single crystal, and the aluminum nitride single crystal layer 20. By the cutting, a layer having strain on the crystal surface (strain layer) is formed on the cut face of the base substrate 10 after the separation step. When the strain layer remains on the base substrate 10, the crystal quality of the aluminum nitride single crystal layer 20 to grow over the base substrate 10 may deteriorate, or residual stress may cause cracks in the aluminum nitride single crystal layer. Thus, the strain layer is removed in the undermentioned renewing polishing step. Therefore, preferably, as an extra space for formation of the strain layer or for removal of the strain layer, the base substrate 10 including the thin films 22, which are at least part of the aluminum nitride single crystal layer 20, layered thereover is separated from the rest of the aluminum nitride single crystal layer 20.

The thickness of the thin films 22 of the aluminum nitride single crystal layer which remain on the base substrate 10 after the separation, is not particularly limited, but is preferably 5 µm to 300 µm. These thin films 22 of the aluminum nitride single crystal layer 20 having a thickness within this range allow the strain layer to be removed through the undermentioned renewing polishing step.

The cutting in the separation step is carried out in parallel to the grown surface (that is, the aluminum-polar face 10a) of the base substrate 10. When a wire saw is used in the separation step, a wire saw of either type of fixed and free abrasive grains may be used. Preferably, the tension of the wire is adjusted as appropriate so that the thickness of an extra space for the cutting will be thin, for example, approximately 100 to 300 µm.

The wire in the cutting may be moved so as to swing. The wire may be successively or intermittently moved in the cutting direction. The swinging movement of the wire during the cutting is properly controlled for preventing cracks from forming due to heat generated by friction in the cutting.

For suppressing crack formation accompanying chipping of the periphery of the substrate in the cutting, one may cover the whole or part of the aluminum nitride single crystal substrate 1 including the base substrate 10 and the aluminum nitride single crystal layer 20 with a resin, a cement, or the like prior to the separation step, and thereafter, perform the cutting. At this time, a common epoxy resin or phenolic resin, or any of waxes can be used as the resin herein. The aluminum nitride single crystal substrate 1 is covered with the resin; thereafter, the resin is cured by a common means such as curing by self-drying, thermosetting, and photo-setting, and thereafter, the cutting is performed. As the cement, common industrial Portland cement, aluminous cement, gypsum, or the like can be used.

When cut in the cutting step, the aluminum nitride single crystal substrate 1 itself may be revolved and swung. The speed of the revolution for the aluminum nitride single crystal substrate 1 is preferably within the range of 1 rpm and 10 rpm.

<Renewing Polishing Step>

The renewing polishing step is a step of polishing the surface of the cut face of the base substrate 10 after the separation. Through the renewing polishing step, the base substrate 10, which is formed from an aluminum nitride single crystal and is to be iteratively used as a base substrate, is produced.

For removing the strain layer in the renewing polishing step, preferably, the surface of the cut face of the base substrate 10 after the separation is polished by more than 10 µm, more preferably polished by at least 30 µm, and further preferably polished by at least 100 µm therefrom. The more the polishing amount is, the more the strain layer can be removed. However, a more polishing amount leads to higher industrial costs. Thus, the polishing amount is preferably at most 600 µm, more preferably at most 200 µm, and further preferably at most 100 µm. The presence or not of the strain layer can be evaluated by a half width of an X-ray omega (w) rocking curve of a (103) face. It is measured under the condition that an incident X-ray and the aluminum-polar face 10a of the base substrate 10 after the renewing polishing is no more than 4°. This half width is preferably no more than 200 arcsec. The incident angle between an incident X-ray and the aluminum-polar face 10a of the base substrate 10 after the renewing polishing is more preferably no more than 2°. In view of current measurement techniques, the lower limit of the incident angle between an incident X-ray and the aluminum-polar face 10a is 0.1°. The half width of the X-ray omega (w) rocking curve of the foregoing crystal face is more preferably at most 100 arcsec, and further preferably at most 80 arcsec. This half width is preferably at least 10 arcsec. In the measurement of the X-ray omega rocking curve of the foregoing specific crystal face, an X-ray source monochromated by being diffracted twice by a (220) face of a germanium single crystal is preferably used.

All the polishing in the renewing polishing step may be carried out by, for example, CMP. For example, when the thickness of the aluminum nitride single crystal layer 20 layered over the base substrate 10 after the separation is thick, CMP may be carried out after the thickness is adjusted in advance to be approximately a desired thickness by a means offering a high polishing rate such as mirror finish lapping.

The properties of the base substrate 10 after the separation, which is obtained in the renewing polishing step, hardly change from the base substrate 10 before the separation. Therefore, the half width of the X-ray omega rocking curve, and the dislocation density of the base substrate 10 after the separation can be equal to those of the base substrate 10 before the separation. When the offset angle of the aluminum-polar face 10a varies in the separation step from a desired angle, the polishing step of adjusting the offset angle of the aluminum-polar face 10a of the base substrate 10 after the separation to be a desired offset angle may be further carried out.

Cleaning the base substrate 10 after the separation, which is obtained in the renewing polishing step, with the detergent including the fluoroorganic compound of the present invention enables the roughness of the nitrogen-polar face to be suppressed, and the base substrate 10, from which foreign substances on the nitrogen-polar face are removed, to be obtained.

<Repetition Step>

The repetition step is a step of using the base substrate 10 obtained in the renewing polishing step as the base substrate 10 (renewed base substrate) for growing a new aluminum nitride single crystal layer 20 over the polished aluminum-polar face 10a of the base substrate 10 obtained in the renewing polishing step. The repetition step may preferably include carrying out the growth step, the separation step, and the renewing polishing step using the renewed base substrate as a new base substrate 10. The repetition step may be iteratively carried out.

<Cleaning Step>

The production method according to the present invention includes the cleaning step of cleaning, with the aforementioned detergent by the aforementioned cleaning method, the aluminum nitride single crystal substrate obtained in the foregoing grinding polishing step, renewing polishing step, and repetition step. For example, the cleaning step may be carried out on the base substrate 10 when the base substrate 10 is separated from the plate after the polishing step, or in the polishing step before the aluminum nitride single crystal substrate is put on the plate, or at both of these timings. In the grinding polishing step, when the aluminum nitride single crystal substrate is put on the plate so that the nitrogen-polar face is opposite the plate, adhesive or the like may be used for fixing the substrate put opposite in the grinding polishing step. The cleaning method according to the present invention enables adhesive or the like adhering onto the nitrogen-polar face in such a case to be also efficiently removed. That is, this cleaning method may be performed before and/or after the grinding polishing step.

For surely removing foreign substances while minimizing the number of times of the cleaning steps, preferably, the cleaning method is performed after the polishing step.

The cleaning step may be performed in each of plural steps among the grinding polishing step, renewing polishing step, and repetition step.

Hereinafter one preferred embodiment concerning the CMP polishing step and the cleaning step of the aluminum nitride single crystal substrate 1 will be shown.

(1) The aluminum-polar face side is fixed to the plate with SHIFTWAX (registered trademark, manufactured by NIKKA SEIKO CO., LTD.), and the nitrogen-polar face side is subjected to CMP processing.

(2) The aluminum-polar face side is removed from the plate, and the opposite nitrogen-polar face side is fixed to the plate with SHIFTWAX, and the aluminum-polar face side is subjected to CMP processing.

(3) The nitrogen-polar face side is removed from the plate, and thereafter, the cleaning step is performed to clean the aluminum-polar face and the nitrogen-polar face.

According to the condition of the substrate after the aluminum nitride single crystal layer has grown, periphery grinding, and/or rough grinding on the aluminum-polar face (the nitrogen-polar face side is fixed to the plate with SHIFTWAX, and the aluminum-polar face side is polished) may be performed before (1).

[Aluminum Nitride Single Crystal Substrate]

The aluminum nitride single crystal substrate, form which foreign substances on the nitrogen-polar face are removed, can be obtained by the production method according to the present invention. The number of foreign substances remaining on the nitrogen-polar face of the aluminum nitride single crystal substrate obtained in this way is very much reduced. On the nitrogen-polar face, the number of foreign substances of several micrometers or more which can be observed at 500 in observation magnification can be less than 1.

Cleaning by the foregoing cleaning method with the foregoing detergent enables the roughness of the nitrogen-polar face to be suppressed, and enables the difference between the average of the mean roughness Ra of the nitrogen-polar face after the cleaning at plural (for example, 5) positions (hereinafter also referred to as "average surface roughness"), and the average surface roughness before the cleaning to be suppressed to be within ±0.4 nm concerning the mean roughness Ra in one field range ((280 μm×210 μm)) when the nitrogen-polar face is measured with a white-light interferometric microscope with an object lens with a magnifying power of 50.

The foregoing cleaning method enables variations of the mean roughness Ra of the nitrogen-polar face at plural positions to be further reduced. Specifically, the average surface roughness of the nitrogen-polar face can be at most 2.0 nm, and the standard deviation of the surface roughness Ra can be suppressed to be at most 0.2 nm. The value obtained by dividing this standard deviation by the average surface roughness (coefficient of variation: CV) can be suppressed to be at most 20%.

Enabling the roughness of the nitrogen-polar face to be suppressed to remove stain is expected to bring further advantages concerning the following. That is, when the aluminum nitride single crystal substrate is fixed to the plate by the use of the nitrogen-polar face as an adhered face for polishing the aluminum-polar face, the removal of stain on the nitrogen-polar face allows the aluminum nitride single crystal substrate to be firmly adhered to the plate. In addition, when the roughness of the nitrogen-polar face can be suppressed, the contact area between the nitrogen-polar face, which is used as the adhered face, and the plate can be increased. Therefore, the aluminum nitride single crystal substrate can be more firmly adhered to the plate. Firmly adhering the aluminum nitride single crystal substrate to the plate enables the polishing precision of the aluminum-polar face to be improved more. In short, enabling the roughness of the nitrogen-polar face to be suppressed to remove stain is considered to contribute to the improvement in the polishing precision of the aluminum-polar face.

EXAMPLES

Hereinafter the present invention will be described in detail with examples. The present invention is not restricted to the following examples. Unless otherwise specified in the following, expression "A to B" concerning numeral values A and B shall mean "at least A and less than B".

The nitrogen-polar faces 1b of aluminum nitride single crystal pieces and the aluminum nitride single crystal substrates 1 used in the following examples and comparative examples (hereinafter also referred to as "evaluation piece" as a general term therefor) were evaluated by observation by means of a white-light interferometric microscope and observation by means of a Nomarski differential interference contrast microscope. The method for this evaluation was as follows.

<Observation by Means of White-Light Interferometric Microscope>

The roughness of the nitrogen-polar face 1b was evaluated by the following method. That is, the center of the nitrogen-polar face 1b was measured by means of a white-light interferometric microscope (NewView (registered trademark) 7300 from AMETEK, Inc.) with an object lens with a magnifying power of 50 to obtain an image of 280 μm×210 μm (58800 μm$^2$). Here, unless otherwise specified, "center" shall be a position of the rotating line of symmetry of the nitrogen-polar face 1b when the shape of the nitrogen-polar face 1b displays rotation symmetry. The mean roughness Ra was calculated by the use of data of the surface altitudes on a line segment of 280 μm in length that was in parallel to one long side among four sides constituting the outer shape of the image from the obtained image. The mean roughness Ra is one example of "surface roughness".

This image was visually checked to qualitatively evaluate the condition of the nitrogen-polar face 1b. Specifically, an area of 100 μm×100 μm at the center of the image was trimmed to be extracted, it was confirmed whether or not the roughness of the nitrogen-polar face 1b (e.g., pits 14 (see FIG. 2(c)) was present in this extracted area of 100 μm×100 μm, and the condition of the nitrogen-polar face 1b was evaluated as follows. The samples of the condition are shown in FIG. 2.

"A" (extremely good): flat condition without roughness or a granulated shape 12 (see FIG. 2)

Figure 2A:
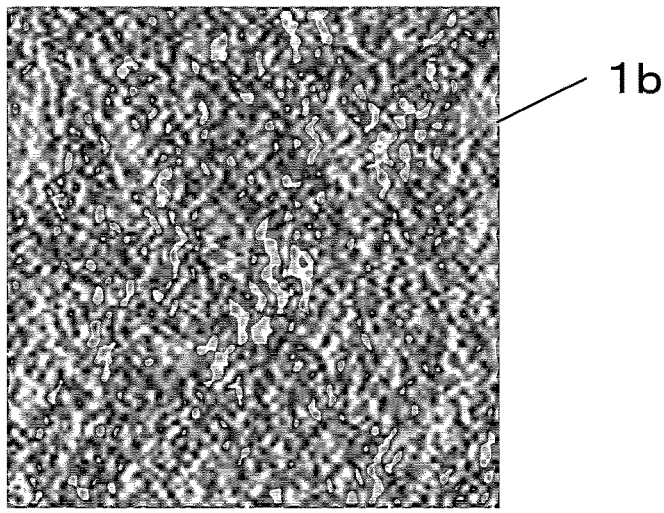
FIG. 2(a) shows a sample of the evaluation of the nitrogen-polar face as the condition "A" (extremely good)
Figure 2B:
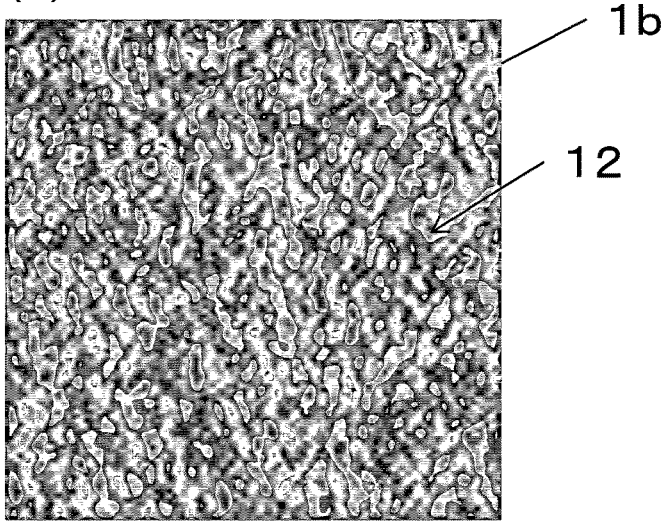
FIG. 2(b) shows a sample of the evaluation of the nitrogen-polar face as the condition "B" (good)
Figure 2C:
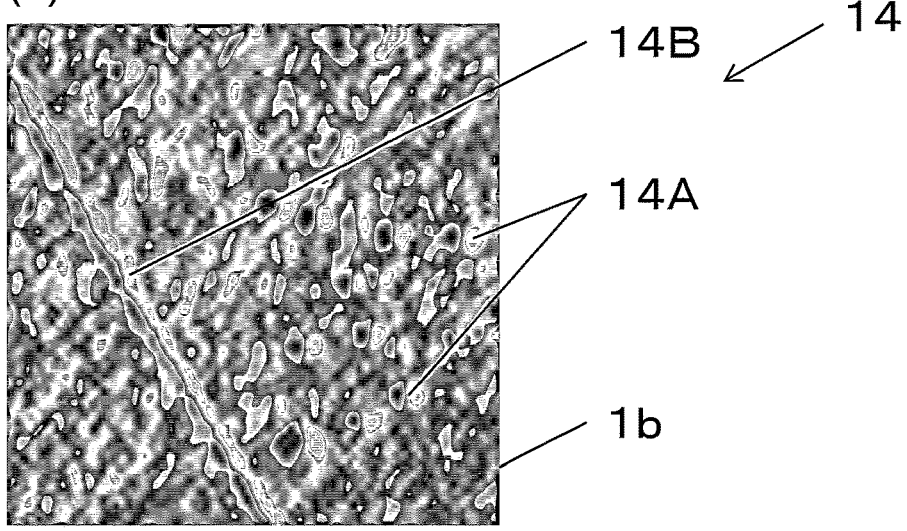
FIG. 2(c) shows a sample of the evaluation of the nitrogen-polar face as the condition "C" (others).

"B" (good): condition where no roughness was confirmed but the granulated shape 12 slightly emerged "C" (others): rough condition FIG. 2 shows samples of the evaluation of the condition of the nitrogen-polar face 1b. FIG. 2(a) is a sample view showing one example of the condition "A", FIG. 2(b) is a sample view showing one example of the condition "B", and FIG. 2(c) is a sample view showing one example of the condition "C".

As shown in FIG. 2(a), flat condition without roughness or the granulated shape 12 on the nitrogen-polar face 1b was evaluated as "A". As shown in FIG. 2(b), condition without conspicuous roughness but with the granulated shape 12 emerged on the nitrogen-polar face 1b was evaluated as "B". As shown in FIG. 2(c), rough condition on the nitrogen-polar face 1b was evaluated as "C". "Roughness" on the nitrogen-polar face 1b encompasses a substantially circular concave pit 14A having a predetermined diameter in a top view, and a rod-like pit 14B having a rod-like shape of a predetermined length in a top view. Hereinafter, the concave pit 14A and the rod-like pit 14B will be also expressed simply as the "pits 14" as a general term when not needing to be distinguished from each other to be identified.

<Observation by Means of Nomarski Differential Interference Contrast Microscope>

The nitrogen-polar face 1b was subjected to brightfield observation with a Nomarski differential interference contrast microscope (ECLIPSE (registered trademark) LVDIA-N manufactured by NIKON CORPORATION) at 500 in observation magnification, and whether stain adhered to the nitrogen-polar face 1b in advance remained or not was visually checked.

<Cleaning Method>

As the cleaning method, any one of the methods of cleaning by irradiating a detergent with an ultrasonic wave (hereinafter also referred to as "ultrasonic cleaning"), cleaning by immersing an evaluation piece in a detergent (hereinafter also referred to as "immersion" simply), and cleaning without irradiating a detergent with an ultrasonic wave was used.

The ultrasonic cleaning was carried out by the method of putting water in an ultrasonic cleaner (SONO CLEANER (registered trademark) 100D manufactured by KAIJO corporation) to a designated water level, and putting, in the water, a covered screw bottle (manufactured by AS ONE Corporation) containing 40 ml of a detergent, and an evaluation piece, and irradiating the detergent with an ultrasonic wave (according to the conditions if the conditions are specified elsewhere for the following examples and comparative examples). The frequency of the ultrasonic wave was 40 kHz. The temperature (liquid temperature of the detergent) was varied in the range of 30° C. to 55° C. The cleaning time was 20 to 30 minutes.

The immersion was carried out by the method of putting, in a screw bottle, 40 ml of a detergent, and an evaluation piece, covering the screw bottle to immerse the evaluation piece in the detergent for a certain period of time (according to the conditions if the conditions are specified elsewhere for the following examples and comparative examples). The immersion was carried out at room temperature (15° C. to 25° C.). The immersing time was 14 hours to 5 days.

The cleaning without an ultrasonic wave was carried out by the method of placing a quartz beaker on a hot plate, and putting 125 ml of a detergent, and an evaluation piece in the beaker. The temperature of the detergent was 50 to 70° C. The cleaning time was varied in the range of 5 to 10 minutes.

<Stain>

For verifying the effect of cleaning, the following foreign substances were adhered as pseudo-stain. Specifically, as the foreign substances, residues of a thermal release tape (manufactured by NITTO DENKO CORPORATION) that is generally used as a substitution for stain caused by organic foreign substances, or SHIFTWAX (registered trademark) used as an adhesive for fixing the aluminum nitride single crystal substrate 1 was used. This stain is one example of foreign substances to be removed.

Production Example 1

(Producing Aluminum Nitride Single Crystal Substrate 1)

The aluminum nitride single crystal substrate 1 used in each of the following examples and comparative examples was produced by using an aluminum nitride single crystal produced by a sublimation method as the base substrate 10, layering an aluminum nitride single crystal over the base substrate 10 by chemical vapor deposition to form the aluminum nitride single crystal layer 20, and finishing the aluminum-polar face 1a or 20a, which was a crystal growth face, and the nitrogen-polar face 1b thereopposite by grinding and CMP to be in the state of mirror faces. Concerning the shape of the obtained aluminum nitride single crystal substrate 1, the outer diameter was 48.5 mm, and the thickness was approximately 500 µm.

Example 1

One aluminum nitride single crystal substrate 1 produced according to production example 1 was prepared. An image of the nitrogen-polar face 1b of this aluminum nitride single crystal substrate 1 was obtained with a white-light interferometric microscope. The mean roughness Ra of this nitrogen-polar face 1b was measured at one point at the center of the aluminum nitride single crystal substrate 1, two respective points apart left and right from the center by 10 mm, and two respective points apart left and right from the center by 20 mm; five points in total. The average of the mean roughness Ra measured at these five points was at most 2.5 nm. The value of the mean roughness Ra measured at each point was also at most 2.5 nm.

In the CMP processing, this aluminum nitride single crystal substrate 1 was fixed to a plate with SHIFTWAX (registered trademark). The SHIFTWAX (registered trademark) was approximately uniformly applied to all over the nitrogen-polar face 1b of the aluminum nitride single crystal substrate 1. The CMP processing was carried out, and right after this, water was poured to make a slurry and an abrasive flow away. Thereafter, when the aluminum nitride single crystal substrate 1 was removed from the plate, the temperature of the plate was set at 120° C. to soften the SHIFTWAX (registered trademark), and the aluminum nitride single crystal substrate 1 was collected. After the collection, it was confirmed whether the SHIFTWAX (registered trademark) adhered to the nitrogen-polar face 1b of the aluminum nitride single crystal substrate 1 or not. The confirmation whether the SHIFTWAX (registered trademark) was present or not was visually carried out using an image obtained by observing with a Nomarski differential interference contrast microscope.

As a detergent, Elnova (registered trademark) V3 (manufactured by TOKUYAMA METEL Corporation), which includes a fluoroorganic compound, was used. According to the safety data sheet (SDS), this Elnova (registered trademark) V3 is a detergent formed from four components: that is, 2H,2H,4H,4H,4H-perfluorobutane, ethylene glycol monobutyl ether, a glycol ether compound other than this ethylene glycol monobutyl ether, and a hydrocarbon compound, among which the content of 2H,2H,4H,4H,4H-perfluorobutane in the total detergent is the highest compared with the other three components; and is a cleaning liquid having a specific gravity at 25° C. of 1.02. For a rinse after the cleaning, Elnova (registered trademark) VR3 (manufactured by TOKUYAMA METEL Corporation), and acetone (for electronics industry use, manufactured by KANTO CHEMICAL CO., INC.) were used. According to the safety data sheet (SDS), Elnova (registered trademark) VR3 includes, as well as Elnova (registered trademark) V3, 2H,2H,4H,4H,4H-perfluorobutane as a fluoroorganic compound, where a content of 2H,2H,4H,4H,4H-perfluorobutane in the total liquid is higher compared with that in Elnova V3, and has a specific gravity at 25° C. of 1.27. When Elnova (registered trademark) VR3 is used as a rinse agent like this, it is noted that at least one selected from the group consisting of ethylene glycol monobutyl ether, the glycol ether compound other than this ethylene glycol monobutyl ether, and the hydrocarbon compound may be slightly (for example, approximately less than 1% of the total liquid) included by bringing it by Elnova (registered trademark) V3 used for cleaning.

The aluminum nitride single crystal substrate 1 was dried with a nitrogen blow. Cleaning was carried out by the aforementioned ultrasonic cleaning; specifically, by the method of putting water in an ultrasonic cleaner to a designated water level, and putting, in the water, a crystallizing dish (manufactured by AS ONE Corporation) on which 100 ml of the detergent, and the evaluation piece was put, and irradiating the detergent with an ultrasonic wave. The frequency of the ultrasonic wave was 40 kHz. The liquid temperature in the cleaning was 40 to 50° C. The cleaning time was 30 minutes.

An image of the nitrogen-polar face 1b of the aluminum nitride single crystal substrate 1 after the cleaning was obtained with a white-light interferometric microscope. The mean roughness Ra of the nitrogen-polar face 1b of the aluminum nitride single crystal substrate 1 after the cleaning was calculated from the measurement values of the surface roughness at the same measurement points as the nitrogen-polar face 1b of the aluminum nitride single crystal substrate 1 before the cleaning. Next, by the following formula (1)

mean roughness change=(average value after the cleaning)−(average value before the cleaning)  (1):

the mean roughness change was calculated. As a result of this, the change from the value before the cleaning was −0.2 nm; that is, the result was that the mean roughness Ra of the nitrogen-polar face 1b of the aluminum nitride single crystal substrate 1 after the cleaning hardly changed from that before the cleaning. "Average value after the cleaning" was the average value of the mean roughness Ra of the aluminum nitride single crystal substrate 1 measured at the foregoing five points after the cleaning, and "average value before the cleaning" was the average value of the mean roughness Ra of the aluminum nitride single crystal substrate 1 measured at the foregoing five points before the cleaning.

was used as the detergent. On a crystallizing dish, 100 ml of isopropyl alcohol was put, and the immersion was carried out at room temperature in the range of 15 and 25° C. for 14 hours.

The nitrogen-polar face 1b of the aluminum nitride single crystal substrate 1 after the cleaning was observed with a Nomarski differential interference contrast microscope. As a result, residues of SHIFTWAX (registered trademark) were confirmed.

The results of example 1 and comparative examples 1 and 2 were summarized as in table 1.

TABLE 1

| | Ra [average value] before cleaning (nm) | Detergent kind | Detergent major component | Liquid temperature (° C.) | Ultrasonic wave (kHz) | Time (min) | Roughness [average value] after cleaning - before cleaning (nm) | Condition of nitrogen-polar face after cleaning | Stain (SHIFTWAX) |
|---|---|---|---|---|---|---|---|---|---|
| Example 1 | ≤2.5 | fluorine-based solvent | hydrofluorocarbon | 40 to 50 | 40 | 30 | −0.2 | A | none |
| Comparative Example 1 | ≤2.5 | | acetone | 40 to 50 | 40 | 30 | | | present |
| Comparative Example 2 | | | isopropyl alcohol | 15 to 25 | — | 14 hours | | | present |

The mean roughness Ra of the nitrogen-polar face 1b at the respective five points after the cleaning was 1.11 nm, 1.44 nm, 1.20 nm, 0.977 nm, and 1.10 nm; the average value of these five points (average surface roughness) was 1.17 nm; the standard deviation was 0.170 nm; and the coefficient of variation (CV) was 14.6%.

An image of 100 μm×100 μm that was obtained by trimming the foregoing image was visually confirmed. As a result, no pits 14 were observed in the range of 100 μm×100 μm. The condition of the nitrogen-polar face 1b was extremely good (evaluation: A).

The nitrogen-polar face 1b of the aluminum nitride single crystal substrate 1 after the cleaning was observed with a Nomarski differential interference contrast microscope. As a result, stain of several micrometers or more which could be confirmed at 500 in observation magnification was not observed. That is, it was confirmed that stain of several micrometers or more was removed from the nitrogen-polar face 1b of the aluminum nitride single crystal substrate 1.

Comparative Example 1

One aluminum nitride single crystal substrate 1 that was the same as in example 1 was prepared. Acetone was used as the detergent. Acetone was also used as the rinse after cleaning. The aluminum nitride single crystal substrate 1 was dried with a nitrogen blow. Other than them, the cleaning was performed under the same conditions in example 1.

The nitrogen-polar face 1b of the aluminum nitride single crystal substrate 1 after the cleaning was observed with a Nomarski differential interference contrast microscope. As a result, residues of SHIFTWAX (registered trademark) were confirmed.

Comparative Example 2

One aluminum nitride single crystal substrate 1 that was the same as in example 1 was prepared. Isopropyl alcohol Production Example 2

(Producing Aluminum Nitride Single Crystal Piece)

An aluminum nitride single crystal substrate 1 produced by the same method as in the production example 1 except that the outer diameter was 23 mm was cut into approximately 5 mm×5 mm to prepare an aluminum nitride single crystal piece.

Example 2

Three aluminum nitride single crystal pieces produced according to production example 2 were prepared. Images of nitrogen-polar faces of these three aluminum nitride single crystal pieces were each obtained with a white-light interferometric microscope. From each of the images, the mean roughness Ra of the nitrogen-polar face of each of the three aluminum nitride single crystal pieces was measured by the foregoing method. As a result, the mean roughness Ra of each of all the aluminum nitride single crystal pieces was at most 2.5 nm.

As the detergent, the aforementioned (see example 1) Elnova (registered trademark) V3 was used. As the rinse after the cleaning, the aforementioned Elnova (registered trademark) VR3, and acetone were used. The aluminum nitride single crystal pieces were dried with a nitrogen blow. The cleaning was carried out by the foregoing method by ultrasonic cleaning. As the cleaning conditions, the liquid temperature was 30 to 40° C., and the cleaning time was 30 minutes.

Images of the nitrogen-polar faces were obtained after the cleaning with a white-light interferometric microscope, and the mean roughness Ra of the nitrogen-polar faces of the aluminum nitride single crystal pieces were measured again. Thereafter, the mean roughness change was calculated by the foregoing formula (1). The calculated change was −0.3 nm. The result was that the mean roughness Ra after the cleaning hardly changed from that before the cleaning. In this example, "average value after the cleaning" was the average value of the mean roughness Ra of the three aluminum nitride single crystal pieces measured after the cleaning, and "average value before the cleaning" was the average value of the mean roughness Ra of the three aluminum nitride single crystal pieces measured before the cleaning. In the following description, the explanation same as that described in example 2 may be omitted.

Images of 100 μm×100 μm each that were obtained by trimming the foregoing images were visually confirmed. As a result, no pits 14 were observed in the range of 100 μm×100 μm. The condition of the nitrogen-polar face was extremely good.

Example 3

The same operation as in example 2 was performed except that the liquid temperature in the cleaning was changed to 40 to 50° C.

Images of the nitrogen-polar faces of the aluminum nitride single crystal pieces after the cleaning were obtained with a white-light interferometric microscope. The mean roughness change of the nitrogen-polar face was 0.1 nm. The result was that the mean roughness Ra of the nitrogen-polar faces of the aluminum nitride single crystal pieces after the cleaning hardly changed from that before the cleaning.

No pits 14 were observed in the range of 100 μm×100 μm as a result of visual observation of the images. The condition of the nitrogen-polar face was extremely good.

Example 4

The same operation as in example 2 was performed except that the liquid temperature in the cleaning was changed to 50 to 55° C., and the cleaning time was changed to 20 minutes.

Images of the nitrogen-polar faces of the aluminum nitride single crystal pieces after the cleaning were obtained with a white-light interferometric microscope. The mean roughness change of the nitrogen-polar face was −0.3 nm. The result was that the mean roughness Ra of the nitrogen-polar faces of the aluminum nitride single crystal pieces after the cleaning hardly changed from that before the cleaning.

No pits 14 were observed in the range of 100 μm×100 μm as a result of visual observation of the images. The condition of the nitrogen-polar face was extremely good.

Example 5

Three aluminum nitride single crystal pieces produced according to production example 2 were prepared. The mean roughness of the nitrogen-polar faces of each of these pieces was measured by the foregoing method. As a result, the mean roughness Ra of each of all the aluminum nitride single crystal pieces was 3.0 nm to 4.0 nm.

Other than the foregoing, the same operation as in example 2 was performed.

Images of the nitrogen-polar faces of the aluminum nitride single crystal pieces after the cleaning were obtained with a white-light interferometric microscope. The mean roughness change of the nitrogen-polar face was −0.1 nm. The result was that the mean roughness Ra of the nitrogen-polar faces of the aluminum nitride single crystal pieces after the cleaning hardly changed from that before the cleaning.

No pits 14 were observed in the range of 100 μm×100 μm as a result of visual observation of the images. The condition of the nitrogen-polar face was good although the granulated shape 12 slightly emerged on the nitrogen-polar faces compared with the nitrogen-polar faces obtained in example 2, 3 or 4.

Example 6

The same operation as in example 5 was performed except that the liquid temperature in the cleaning was changed to 40 to 50° C.

Images of the nitrogen-polar faces of the aluminum nitride single crystal pieces after the cleaning were obtained with a white-light interferometric microscope. The absolute value of the mean roughness change of the nitrogen-polar face was less than nm. The result was that the mean roughness Ra of the nitrogen-polar faces of the aluminum nitride single crystal pieces after the cleaning hardly changed from that before the cleaning.

No pits 14 were observed in the range of 100 μm×100 μm as a result of visual observation of the images. The condition of the nitrogen-polar face was good although the granulated shape 12 slightly emerged on the nitrogen-polar faces.

Example 7

The same operation as in example 5 was performed except that the liquid temperature in the cleaning was changed to 50 to 55° C., and the cleaning time was changed to 20 minutes.

Images of the nitrogen-polar faces of the aluminum nitride single crystal pieces after the cleaning were obtained with a white-light interferometric microscope. The absolute value of the mean roughness change of the nitrogen-polar face was less than nm. The result was that the mean roughness Ra of the nitrogen-polar faces of the aluminum nitride single crystal pieces after the cleaning hardly changed from that before the cleaning.

No pits 14 were observed in the range of 100 μm×100 μm as a result of visual observation of the images. The condition of the nitrogen-polar face was good although the granulated shape 12 slightly emerged on the nitrogen-polar faces.

Example 8

Three aluminum nitride single crystal pieces produced according to production example 2 were prepared. The mean roughness of the nitrogen-polar faces of each of these pieces was measured by the foregoing method. As a result, the mean roughness Ra of each of all the aluminum nitride single crystal pieces was at most 2.5 nm.

As the detergent, Elnova (registered trademark) V3 was used as well as examples 2 to 7. As the rinse after the cleaning, Elnova (registered trademark) VR3, and acetone were used in order. The aluminum nitride single crystal pieces were dried with a nitrogen blow. The cleaning was carried out by the foregoing method by immersion. The immersion was performed at room temperature of 15 to 25° C., and the immersing time was 2 days.

Images of the nitrogen-polar faces of the aluminum nitride single crystal pieces after the cleaning were obtained with a white-light interferometric microscope. The mean roughness change of the nitrogen-polar face was 0.1 nm. The result was that the mean roughness Ra of the nitrogen-polar faces of the aluminum nitride single crystal pieces after the cleaning hardly changed from that before the cleaning.

No pits 14 were observed in the range of 100 μm×100 μm as a result of visual observation of the images. The condition of the nitrogen-polar face was extremely good.

Comparative Example 3

Three aluminum nitride single crystal pieces produced according to production example 2 were prepared. The mean roughness of the nitrogen-polar faces of each of these pieces was measured by the foregoing method. As a result, the mean roughness Ra of each of all the aluminum nitride single crystal pieces was at most 2.5 nm.

As the detergent, acetone was used. As the rinse after the cleaning, acetone was also used. Drying was carried out with a nitrogen blow. Other than the foregoing, the operation was performed by the same cleaning method and under the same conditions as in example 2.

Images of the nitrogen-polar faces of the aluminum nitride single crystal pieces after the cleaning were obtained with a white-light interferometric microscope. The mean roughness change of the nitrogen-polar face was 0.7 nm. The result was that the mean roughness Ra of the nitrogen-polar faces of the aluminum nitride single crystal pieces after the cleaning hardly changed from that before the cleaning. No pits 14 were observed in the range of 100 μm×100 μm as a result of visual observation of the images.

However, as looked at in the following reference comparative example 1, when acetone was used as the detergent, stain was not removed effectively.

Comparative Example 4

The same operation as in comparative example 3 was performed except that the liquid temperature in the cleaning was changed to 40 to 50° C.

Images of the nitrogen-polar faces of the aluminum nitride single crystal pieces after the cleaning were obtained with a white-light interferometric microscope. The mean roughness change of the nitrogen-polar face was 0.3 nm. The result was that the mean roughness Ra of the nitrogen-polar faces of the aluminum nitride single crystal pieces after the cleaning hardly changed from that before the cleaning. No pits 14 were observed in the range of 100 μm×100 μm as a result of visual observation of the images.

However, as looked at in the following reference comparative example 1, when acetone was used as the detergent, stain was not removed effectively.

Comparative Example 5

The same operation as in comparative example 3 was performed except that the liquid temperature in the cleaning was changed to 50 to 55° C., and the cleaning time was changed to 20 minutes.

Images of the nitrogen-polar faces of the aluminum nitride single crystal pieces after the cleaning were obtained with a white-light interferometric microscope. The absolute value of the mean roughness change of the nitrogen-polar face was less than 0.1 nm. The result was that the mean roughness Ra of the nitrogen-polar faces of the aluminum nitride single crystal pieces after the cleaning hardly changed from that before the cleaning. No pits 14 were observed in the range of 100 μm×100 μm as a result of visual observation of the images.

However, as looked at in the following reference comparative example 1, when acetone was used as the detergent, stain was not removed effectively.

Comparative Example 6

Three aluminum nitride single crystal pieces produced according to production example 2 were prepared. The mean roughness of the nitrogen-polar faces of each of these pieces was measured by the foregoing method. As a result, the mean roughness Ra of each of all the aluminum nitride single crystal pieces was at most 2.5 nm.

As the detergent, an acid detergent that was a mixture of 100 ml of sulfuric acid (guaranteed reagent, manufactured by FUJIFILM Wako Pure Chemical Corporation) and 25 ml of hydrogen peroxide (guaranteed reagent, manufactured by FUJIFILM Wako Pure Chemical Corporation) (the mixing ratio was 4:1) was used. As the rinse after the cleaning, ultrapure water was used. The aluminum nitride single crystal pieces were dried with a nitrogen blow. The cleaning was carried out by the method of cleaning with no ultrasonic wave. The temperature of the detergent was 50 to 70° C. The cleaning time was 5 minutes.

Images of the nitrogen-polar faces of the aluminum nitride single crystal pieces after the cleaning were obtained with a white-light interferometric microscope. The mean roughness change of the nitrogen-polar face was 1.4 nm. The cleaning deteriorated the mean roughness Ra of the nitrogen-polar face. As a result of visual observation of the images, plural concave pits 14A and one rod-like pit 14B were also observed in the range of 100 μm×100 μm.

Comparative Example 7

The same operation as in comparative example 6 was performed except that the cleaning time was changed to 10 minutes.

Images of the nitrogen-polar faces of the aluminum nitride single crystal pieces after the cleaning were obtained with a white-light interferometric microscope. The mean roughness change of the nitrogen-polar face was 1.7 nm. The cleaning deteriorated the mean roughness Ra of the nitrogen-polar face. As a result of visual observation of the images, plural concave pits 14A were also observed in the range of 100 μm×100 μm.

Comparative Example 8

Three aluminum nitride single crystal pieces produced according to production example 2 were prepared. The mean roughness Ra of the nitrogen-polar faces of each of these pieces was measured by the foregoing method. As a result, the mean roughness Ra of each of all the aluminum nitride single crystal pieces was at most 2.5 nm.

As the detergent, 40 ml of a 10% diluted solution of CLEANTHROUGH (registered trademark) KS-3053 (manufactured by Kao Corporation) with ultrapure water was used. According to the safety data sheet (SDS), the major component of this CLEANTHROUGH (registered trademark) KS-3053 is alkyl carbitol. As the rinse after the cleaning, ultrapure water was used. Drying was carried out with a nitrogen blow. The cleaning method was carried out by the same method as in comparative example 5. The cleaning time was 20 minutes.

Images of the nitrogen-polar faces of the aluminum nitride single crystal pieces after the cleaning were obtained with a white-light interferometric microscope. The mean roughness change of the nitrogen-polar face was 2.6 nm. The cleaning deteriorated the mean roughness Ra of the nitrogen-polar face. As a result of visual observation of the images, plural concave pits 14A were also observed in the range of 100 μm×100 μm.

Complement Experiment

In example 1, the cleaning concerning the removal of stain was looked at by adhering residues of SHIFTWAX (registered trademark) as one example. In the following reference examples, the cleaning was looked at by adhering residues of a thermal release tape instead of residues of SHIFTWAX (registered trademark). For a subject to be evaluated, the aluminum nitride single crystal pieces produced according to production example 1 were used in example 1, but a glass piece was used in the following examples.

(Stain)

Stain was adhered by pasting, and thereafter, pressurizing, with a pasting machine, a thermal release tape on the surface of a glass plate before cutting; thereafter, heating the thermal release tape to 100 to 150° C. to foam the thermal release tape, and removing the tape from the surface of the glass plate.

(Evaluation)

The surface of the glass piece after the cleaning was subjected to brightfield observation with a Nomarski differential interference contrast microscope at 500 in observation magnification, and whether residues of the thermal release tape were present on the surface of the glass piece or not was visually checked.

Production Example 3

(Producing Glass Piece)

The glass piece used in each of the following reference examples and reference comparative examples were produced by cutting a glass plate of 100 mm×100 mm having a thickness of 1 mm (manufactured by Matsunami Glass Ind., Ltd.) with a glass cutter into a size of approximately 2 mm×7 mm.

Reference Example 1

(Detergent Including Fluorine-Based Compound)

Three glass pieces produced according to production example 3 were prepared, and each cleaned under the same cleaning conditions as in examples 2, 3, 4 and 8.

After the cleaning, the surfaces of the glass pieces were observed with a Nomarski differential interference contrast microscope. As a result, stain of several micrometers or more which could be confirmed at 500 in observation magnification was not observed on every surface. That is, it was confirmed that stain of several micrometers or more was removed from the surfaces of the glass pieces under every condition.

Reference Comparative Example 1

(Acetone and Isopropyl Alcohol)

Three glass pieces produced according to production example 3 were prepared, and each cleaned under the same cleaning conditions as in comparative examples 3, 4 and 5.

The surfaces of the glass pieces after the cleaning were observed with a Nomarski differential interference contrast microscope. As a result, stain was confirmed on all the three glass pieces under every condition. This stain was different from that adhered before the cleaning in shape, and had a more dotted shape than that confirmed before the cleaning. From this, it was considered that the stain had been dissolved and were almost removed, or had been removed from the surface of the glass pieces during the cleaning, but adhered again.

Three glass pieces produced according to production example 3 were prepared. As the detergent, isopropyl alcohol (for electronics industry use, manufactured by KANTO CHEMICAL CO., INC.) was used. As the rinse after the cleaning, isopropyl alcohol was also used. The glass pieces were dried with a nitrogen blow. Other than the foregoing, the operation was performed by the same cleaning method and under the same conditions as in comparative example 5 except that the liquid temperature in the cleaning was changed to 40 to 55° C.

The surfaces of the glass pieces after the cleaning were observed with a Nomarski differential interference contrast microscope. As a result, residues were confirmed on all the three glass pieces.

Three glass pieces produced according to production example 3 were prepared. As the detergent, acetone was used. As the rinse after the cleaning, acetone was also used. The glass pieces were dried with a nitrogen blow. The cleaning was carried out by the foregoing method by immersion. The immersion was performed at room temperature of 15 to 25° C., and the immersing time was 5 days.

The surfaces of the glass pieces after the cleaning were observed with a Nomarski differential interference contrast microscope. As a result, residues were confirmed on all the three glass pieces.

Three glass pieces produced according to production example 3 were prepared. As the detergent, isopropyl alcohol was used. As the rinse after the cleaning, isopropyl alcohol was also used. The glass pieces were dried with a nitrogen blow. The cleaning method was carried out by the foregoing method by immersion. The immersion was performed at room temperature of 15 to 25° C., and the immersing time was 5 days.

The surfaces of the glass pieces after the cleaning were observed with a Nomarski differential interference contrast microscope. As a result, residues were confirmed on all the three glass pieces.

Reference Comparative Example 2

(Acid Detergent)

Three glass pieces produced according to production example 3 were prepared, and cleaned under the same cleaning conditions as in comparative example 6.

The surfaces of the glass pieces after the cleaning were observed with a Nomarski differential interference contrast microscope. As a result, residues were confirmed on all the three glass pieces.

The cleaning was also performed under the same cleaning conditions as in comparative example 7.

The surfaces of the glass pieces after the cleaning were observed with a Nomarski differential interference contrast microscope. As a result, it was confirmed that stain was removed from all the three glass pieces.

Reference Comparative Example 3

(Alkaline Detergent)

Three glass pieces produced according to production example 3 were prepared, and cleaned under the same cleaning conditions as in comparative example 8.

The surfaces of the glass pieces after the cleaning were observed with a Nomarski differential interference contrast microscope. As a result, residues were confirmed on all the three glass pieces.

The results of examples 2 to 8, comparative examples 3 to 8, reference example 1, and reference comparative examples 1 to 3 were summarized as in table 2.

TABLE 2

| | Ra [average value] before cleaning (nm) | Detergent kind | Detergent major component | Liquid temperature (° C.) | Ultrasonic wave (kHz) | Time (min) | Roughness [average value] after cleaning - before cleaning (nm) | Condition of nitrogen-polar face after cleaning | Stain (thermal release tape) |
|---|---|---|---|---|---|---|---|---|---|
| Example 2 | at most 2.5 | fluorine-based solvent | hydrofluorocarbon | 30 to 40 | 40 | 30 | −0.3 | A | none (reference example 1) |
| Example 3 | | | | 40 to 50 | 40 | 30 | 0.1 | A | none (reference example 1) |
| Example 4 | | | | 50 to 55 | 40 | 20 | −0.3 | A | none (reference example 1) |
| Example 5 | at most 4.0 | | | 30 to 40 | 40 | 30 | −0.1 | B | |
| Example 6 | (at least 3.0) | | | 40 to 50 | 40 | 30 | 0.0 | B | |
| Example 7 | | | | 50 to 55 | 40 | 20 | 0.0 | B | |
| Example 8 | at most 2.5 | | | 15 to 25 | 1 | 2 days | 0.1 | A | none (reference example 1) |
| Comparative Example 3 | at most 2.5 | | acetone | 30 to 40 | 40 | 30 | 0.7 | A | present (reference comparative example 1) |
| Comparative Example 4 | | | | 40 to 50 | 40 | 30 | 0.3 | A | present (reference comparative example 1) |
| Comparative Example 5 | | | | 50 to 55 | 40 | 20 | 0.0 | A | present (reference comparative example 1) |
| Reference Comparative Example 1 | | | isopropyl alcohol acetone isopropyl alcohol | 40 to 55 15 to 25 15 to 25 | 40 — — | 20 5 days 5 days | | | present present present |
| Comparative Example 6 | at most 2.5 | acid detergent | sulfuric acid, hydrogen peroxide (4:1) | 50 to 70 | none | 5 | 1.4 | C | present (reference comparative example 2) |
| Comparative Example 7 | | | sulfuric acid, hydrogen peroxide (4:1) | 50 to 70 | none | 10 | 1.7 | C | none (reference comparative example 2) |
| Comparative Example 8 | | alkaline detergent | alkyl carbitol | 50 to 55 | 40 | 20 | 2.6 | C | present (reference comparative example 3) |

As shown in comparative examples 6 to 8, an acid or alkaline detergent was not suitable for cleaning a nitrogen-polar face, particularly a super-flat nitrogen-polar face because the nitrogen-polar face roughened. This is considered to be because an acid or alkaline detergent decomposes a nitrogen-polar face. As shown in comparative examples 6 and 7, when the cleaning time was shortened when an acid detergent was used, residues could not be removed.

As shown in comparative examples 3 to 5, and reference comparative example 1, acetone or isopropyl alcohol allowed the roughness of the nitrogen-polar face to be almost suppressed, but brought about no effective result concerning the removal of stain. It is considered that acetone or isopropyl alcohol does not decompose a nitrogen-polar face, and thus, allows the roughness of a nitrogen-polar face to be almost suppressed, but hardly allows particles and metallic or ionic impurities of an order of $1/10$ to several micrometers to be removed, which makes it difficult to remove organic foreign substances after polishing by CMP.

In contrast, as shown in examples 1 to 8, a detergent including a fluoroorganic compound is considered to be suitable for effectively removing stain while suppressing the roughness of the nitrogen-polar face. This is considered to be because a detergent containing a fluoroorganic compound does not decompose a nitrogen-polar face, but has a component that allows foreign substances to be removed without the removed foreign substances adhered again.

REFERENCE SIGNS LIST

1 aluminum nitride single crystal substrate
1a aluminum-polar face of the aluminum nitride single crystal substrate
1b nitrogen-polar face of the aluminum nitride single crystal substrate
10 base substrate (substrate formed from an aluminum nitride single crystal)
10a aluminum-polar face of the base substrate
10b nitrogen-polar face of the base substrate
20 aluminum nitride single crystal layer
20a aluminum-polar face of the aluminum nitride single crystal layer
20b nitrogen-polar face of the aluminum nitride single crystal layer
22 thin film
12 granulated shape
14 pit
14A concave pit
14B rod-like pit

The invention claimed is:

1. A method of cleaning a group III nitride single crystal substrate having a group III element-polar face, and a nitrogen-polar face opposite the group III element-polar face, the method comprising:
   cleaning the nitrogen-polar face with a detergent including a fluoroorganic compound.

2. The method of cleaning a group III nitride single crystal substrate according to claim 1, wherein the fluoroorganic compound includes hydrofluorocarbon.

3. The method of cleaning a group III nitride single crystal substrate according to claim 2, wherein
the hydrofluorocarbon is a compound represented by the following formula (1):

$$C_nH_{2n+2-m}F_m \quad (1)$$

where in the formula (1), n is an integer of 2 to 8, and m is an integer satisfying $3 \leq m \leq 2n+2$.

4. The method of cleaning a group III nitride single crystal substrate according to claim 1, wherein
the detergent has a specific gravity at 25° C. of 0.80 to 1.28.

5. The method of cleaning a group III nitride single crystal substrate according to claim 1, wherein
the detergent further includes a hydrocarbon compound.

6. The method of cleaning a group III nitride single crystal substrate according to claim 1, wherein
surface roughness of the nitrogen-polar face of the group III nitride single crystal substrate is at most 4.0 nm.

7. A method of producing a group III nitride single crystal substrate having a group III element-polar face, and a nitrogen-polar face opposite the group III element-polar face, the method comprising:

preparing the group III nitride single crystal substrate;
polishing at least the nitrogen-polar face; and
cleaning the nitrogen-polar face by the method of cleaning a group III nitride single crystal substrate according to claim 1 after either one of the preparing and the polishing.

8. The method of producing a group III nitride single crystal substrate according to claim 7, wherein the cleaning is performed after the polishing.

9. The method of producing a group III nitride single crystal substrate according to claim 7, wherein
the cleaning further includes immersing the group III nitride single crystal substrate in the detergent, and irradiating the detergent, in which the group III nitride single crystal substrate is immersed, with an ultrasonic wave.

10. The method of producing a group III nitride single crystal substrate according to claim 7, wherein
the cleaning further includes: first cleaning the group III nitride single crystal substrate with the detergent; and second cleaning the group III nitride single crystal substrate after the first cleaning with a rinse agent having a higher content of the fluoroorganic compound than the detergent in the first cleaning.

* * * * *